United States Patent [19]

Orita et al.

[11] Patent Number: 5,374,907
[45] Date of Patent: Dec. 20, 1994

[54] CHIP TYPE OF NOISE SUPPRESSING FILTER FOR SUPPRESSING NOISE ELECTROMAGNETICALLY GENERATED AND METHOD FOR MANUFACTURING THE FILTER

[75] Inventors: Takeshi Orita; Koji Ijiri, both of Osaka; Nishimura Fumikazu, Kyoto; Chikao Hata, Osaka; Tatsumi Nakano, Miyazaki, all of Japan

[73] Assignee: Matsushita Electric Industrial Co., Ltd., Osaka, Japan

[21] Appl. No.: 25,463

[22] Filed: Mar. 3, 1993

[30] Foreign Application Priority Data

Mar. 5, 1992 [JP] Japan ................... 4-048198

[51] Int. Cl.⁵ ................... H03H 7/01; H01F 17/06
[52] U.S. Cl. ................... 333/181; 333/185; 336/175
[58] Field of Search ........... 333/177, 181–185, 333/12; 336/175, 176, 92, 192, 221; 439/607, 620

[56] References Cited

U.S. PATENT DOCUMENTS

| | | | |
|---|---|---|---|
| 4,719,433 | 1/1988 | Häckel et al. | 333/185 X |
| 4,758,808 | 7/1988 | Sasaki et al. | 333/185 |
| 4,908,590 | 3/1990 | Sakamoto et al. | 333/183 |

FOREIGN PATENT DOCUMENTS

| | | | |
|---|---|---|---|
| 158909 | 4/1989 | Japan | . |
| 0301311 | 12/1990 | Japan | 333/185 |

*Primary Examiner*—Seungsook Ham
*Attorney, Agent, or Firm*—Lowe, Price, Leblanc & Becker

[57] ABSTRACT

A chip type of noise suppressing filter consists of an almost rectangular solid shaped ferrite core in which a magnetic field is induced, two penetration holes penetrating into a central portion of the ferrite core from a front side thereof to a back side thereof, and a metallic terminal formed of a metallic plate in which an electric current flows across the magnetic field induced in the ferrite core. The metallic terminal consists of two internal terminals inserted into the penetration holes, and two external terminals forcibly fitted on end surfaces of the ferrite core. The internal terminals is connected with each other at the back side of the ferrite core, and the external terminals being connected with the internal terminals at the front side of the ferrite core. Therefore, the electric current flows through one of the external terminals, one of the internal terminals, the other internal terminal, and the other external terminal, in that order. Because the external and internal terminals are formed of the metallic plate, the inductance of the filter is set to a regular value.

3 Claims, 16 Drawing Sheets

FIG. 21A
FIG. 21D
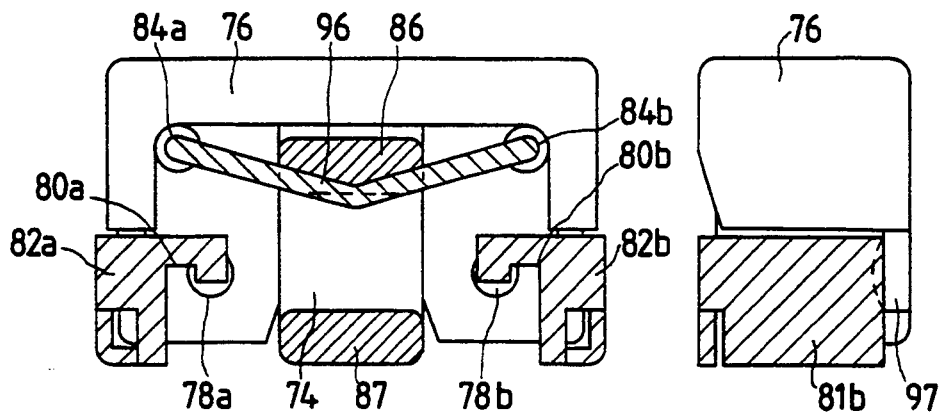
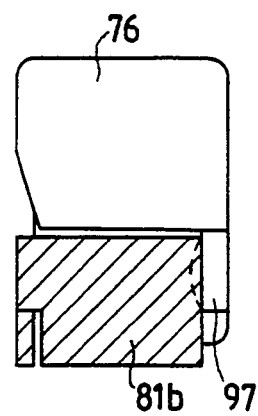
FIG. 21B
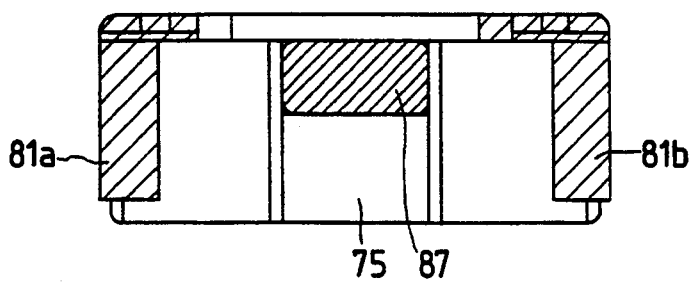
FIG. 21C
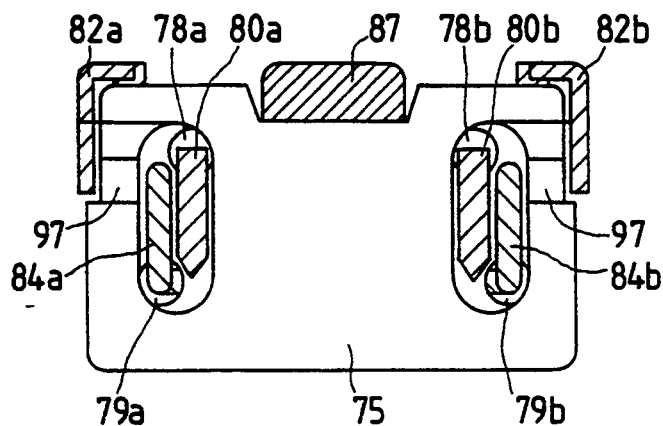

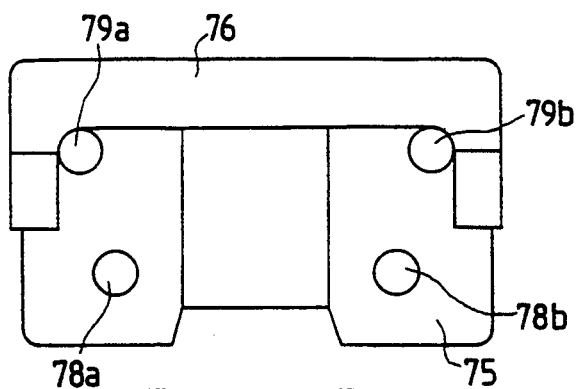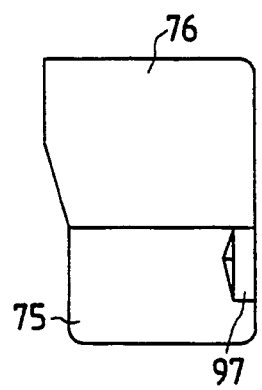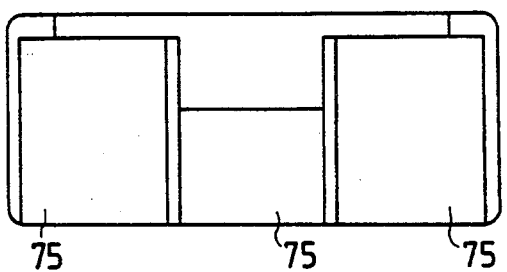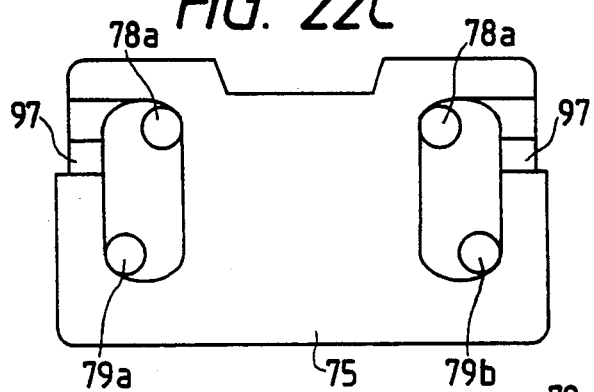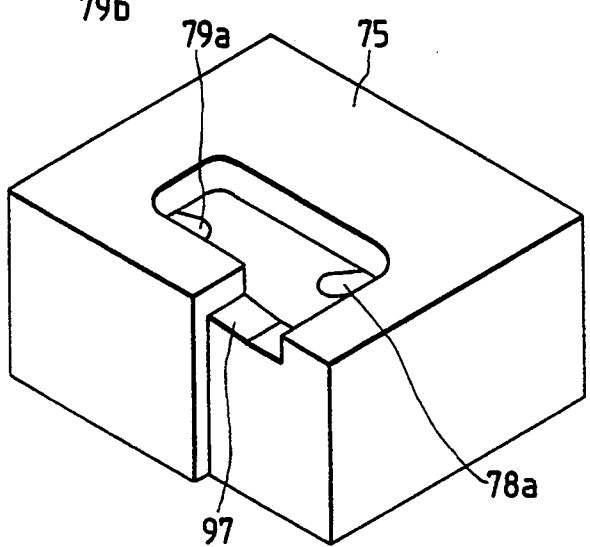

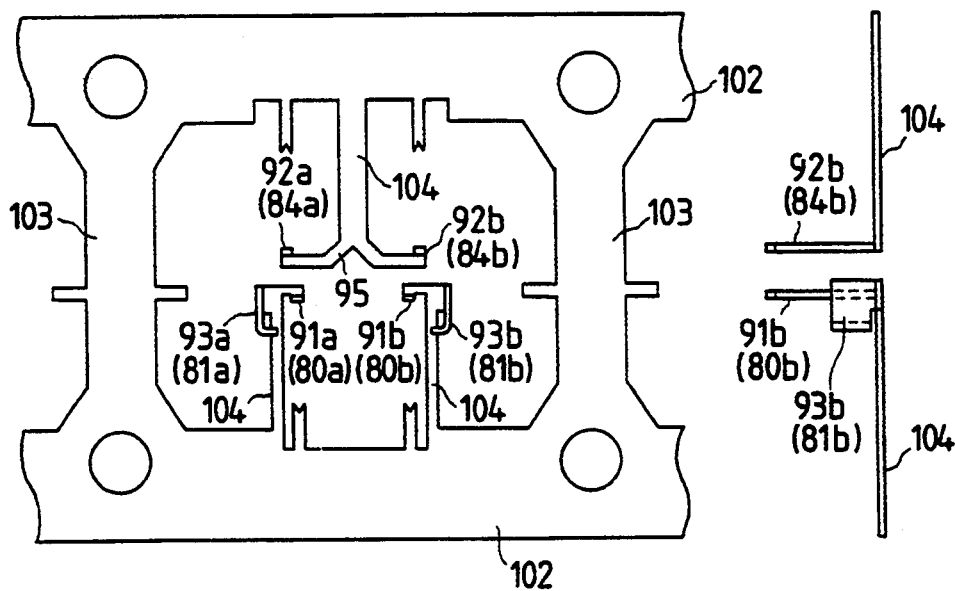
FIG. 29A
FIG. 29B
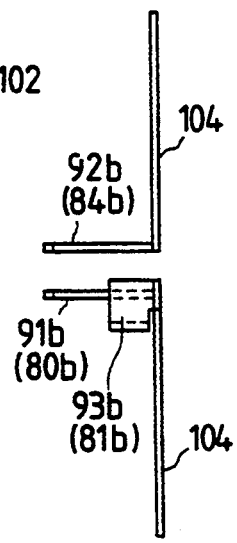
FIG. 29C

CHIP TYPE OF NOISE SUPPRESSING FILTER FOR SUPPRESSING NOISE ELECTROMAGNETICALLY GENERATED AND METHOD FOR MANUFACTURING THE FILTER

BACKGROUND OF THE INVENTION

1. FIELD OF THE INVENTION

The present invention relates to a chip type of noise suppressing filter for suppressing noise electromagnetically generated in signal lines or electric source lines of an electronic apparatus, and a method for manufacturing the noise suppressing filter.

2. DESCRIPTION OF THE RELATED ART

A chip type of noise suppressing filter has been manufactured to suppress noise electromagnetically generated in signal lines or electric source lines of an electronic apparatus.

FIG. 1 is an exploded and diagonal view of a conventional noise suppressing filter.

As shown in FIG. 1, a conventional noise suppressing filter 11 comprises a chip capacitor 12 for holding electric charges, and a U-shaped ferrite core 13 having a hollow portion 13a. The chip capacitor 12 is put in the hollow portion 13a of the ferrite core 13. The ferrite core 13 is provided with a pair of through holes which each penetrate the ferrite core 13 from the hollow portion 13a thereof to an outside thereof and a pair of through-hole conductors 14 put in the through-holes. Each of the through-hole conductors 14 functions as an induction coil.

The filter 11 further comprises a pair of external electrodes 15 which each are attached to a side surface of the ferrite core 13, and an intermediate electrode 16 put in the hollow portion 13a of the ferrite core 13. Each of the external electrodes 15 is provided for one of the through-hole conductors 14 to be electrically connected with an external line. The intermediate electrode 16 is provided for the chip capacitor 12 to be electrically connected with another external line.

Also, the chip capacitor 12 put in the ferrite core 13 is provided with a pair of electrodes 12a at both ends thereof. One of the electrodes 12a is electrically connected with the-intermediate electrode 16 through a piece of conductor 17. Another electrode 12a is electrically connected with the through-hole conductors 14 through a piece of conductor 18 which is put between the electrode 12a and surfaces of the through-hole conductors 14 exposed to the hollow portion 13a of the ferrite core 13.

FIG. 2 is an equivalent circuit of the conventional noise suppressing filter 11 shown in FIG. 1.

In the above configuration, as is well known, the conventional noise suppressing filter 11 in which one of the through-hole conductors 14, the chip capacitor 12 and another through-hole conductor 14 is arranged in series in that order suppresses noise electromagnetically generated in signal lines or electric source lines of an electronic apparatus which is connected with the conventional noise suppressing filter 11 through the external lines.

Next, a conventional method for manufacturing the conventional noise suppressing filter 11 is described.

The external electrodes 15, the intermediate electrode 16, and the conductors 17, 18 are produced by printing silver paste on the ferrite core 13 so that a film type of wiring network is produced on the ferrite core 13. In this case, the thickness of the external electrodes 15 and the intermediate electrode 16 ranges from several tens $\mu$m to several hundreds $\mu$m.

Also, the through-hole conductors 14 are produced by pouring the silver paste into the through-holes of the ferrite core 13.

However, because the external electrodes 15 and the intermediate electrode 16 are formed of the film type of wiring network, the external electrodes 15 and the intermediate electrode 16 are melted and cut out when a comparatively large intensity of electric current flows through the external electrodes 15 and the intermediate electrode 16. Therefore, the intensity of the electric current flowing through the conventional noise suppressing filter 11 is limited to a comparatively small value. As a result, in cases where a comparatively large intensity of electric current flows through an electronic circuit such as an electric source circuit, noise generated in the electronic circuit can not be suppressed by the conventional noise suppressing filter 11 because the electric current having the comparatively large intensity can not flow through the conventional noise suppressing filter 11.

Also, the silver paste must be poured into the through holes provided in the ferrite core 13 to produce the through-hole conductors 14. In addition, the silver paste must be printed several times to produce the external electrodes 15 and the intermediate electrode 16 while rotating the ferrite core 13, and the silver paste printed must be dried each time the silver paste is printed on a surface of the ferrite core 13. The silver paste is generally printed on five surfaces of the ferrite core 13.

Therefore, the manufacture of the conventional noise suppressing filter 11 becomes complicated.

In addition, when the silver paste is poured into the through holes to produce the through-hole conductor 14, the silver paste is leaked out from the through holes. Therefore, the through-hole conductors 14 are incompletely and unevenly solidified in the through holes. As a result, inductance of the through-hole conductor 14 can not be set to a regular value. Accordingly, there is a drawback that the conventional noise suppressing filter 11 having a regular value of inductance can not be reliably manufactured.

SUMMARY OF THE INVENTION

A first object of the present invention is to provide, with due consideration to the drawbacks of such a conventional noise suppressing filter, a chip type of noise suppressing filter in which a large intensity of electric current flows and inductance is set to a regular value.

Also, a second object of the present invention is to provide a method for easily and reliably manufacturing the noise suppressing filter.

The first object is achieved by the provision of a chip type of noise suppressing filter, comprising:

a rectangular solid shaped ferrite core in which a magnetic field is induced;

at least two penetration holes respectively penetrating into a central portion of the ferrite core from a front side of the ferrite core to a back side of the ferrite core; and a metallic terminal in which an electric current flows across the magnetic field induced in the ferrite core, the metallic terminal comprising
 (1) two internal terminals inserted into the penetration holes in one-to-one correspondence, the internal terminals being connected with each other at the back side of the ferrite core, and (2) two external terminals forcibly fitted on both end surfaces of the ferrite core in one-to-one correspondence, the external terminals being connected with the internal terminals in one-to-one correspondence at the front side of the ferrite core.

In the above configuration, an electric current provided from an external line flows one of the external terminals, one of the internal terminals connected to one of the external terminals, the other internal terminal, and the other external terminal connected to the other internal terminal in that order. In this case, because the electric current flows across the magnetic field, the ferrite core with the metallic terminal functions as the noise suppressing filter.

Also, the internal terminals are not made of a film type of wiring network but made of terminals generally utilized. Therefore, a large intensity of electric current can flow through the metallic terminal.

In addition, because the internal terminals are made of the metallic plate, the inductance of the internal terminals arranged in series can be accurately set to a regular value even though the internal terminals are inserted into the penetration holes.

Furthermore, the external terminals are forcibly fitted to the ferrite core. Therefore, the metallic terminal can be tightly connected with the ferrite core so that both the ferrite core and the metallic terminal crossing the magnetic field induced by the ferrite core can reliably function as the noise suppressing filter.

It is preferred that the metallic terminal composed of the internal terminals and the external terminals be made of a metallic plate.

In the above configuration, because the internal terminals and the external terminals are made of a metallic plate, a large intensity of electric current can reliably flow through the metallic terminal. Also, the inductance of the metallic terminal can be reliably set to a regular value.

Also, the first object is achieved by the provision of a chip type of noise suppressing filter, comprising:
- a rectangular solid shaped ferrite core in which a magnetic field is induced;
- at least two first penetration holes respectively penetrating into a central portion of the ferrite core from a front side of the ferrite core to a back side of the ferrite core;
- at least two second penetration holes respectively penetrating into the central portion of the ferrite core from the front side of the ferrite core to the back side of the ferrite core; and
- a plate type of metallic terminal in which an electric current flows across the magnetic field induced in the ferrite core, the metallic terminal comprising
  (1) two first internal terminals inserted into the first penetration holes in one-to-one correspondence, the first internal terminals being connected with each other at the front side of the ferrite core,
  (2) two second internal terminals inserted into the second penetration holes in one-to-one correspondence, the second internal terminals being connected with the first internal terminals in one-to-one correspondence at the back side of the ferrite core, and
  (3) two external terminals forcibly fitted on both end surfaces of the ferrite core in one-to-one correspondence, the external terminals being connected with the second internal terminals in one-to-one correspondence at the front side of the ferrite core.

In the above configuration, an electric current provided from an external line flows one of the external terminals, one of the second internal terminals connected with one of the external terminals, one of the first internal terminals connected with one of the second internal terminals, the other first internal terminal, the other second internal terminal, and the other external terminal in that order. In this case, because the electric current flows across the magnetic field, the ferrite core with the metallic terminal functions as the noise suppressing filter.

Also, the first and second internal terminals are not made of a film type of wiring network but made of terminals generally utilized. Therefore, a large intensity of electric current can flow through the metallic terminal.

In addition, because the first and second internal terminals are made of the metallic plate, the inductance of the first internal terminals and the inductance of the second internal terminals can be accurately set to a regular value even though the first and second internal terminals are inserted into the first and second penetration holes.

Furthermore, the external terminals are forcibly fitted to the ferrite core. Therefore, the metallic terminal and the ferrite core can reliably function as the noise suppressing filter.

In addition, the first object is achieved by the provision of a chip type of noise suppressing filter, comprising:
- a rectangular solid shaped ferrite core in which a magnetic field is induced, a groove being provided in a front side of the ferrite core;
- a chip capacitor put in the groove of the ferrite core for holding charges;
- at least two first penetration holes respectively penetrating into a central portion of the ferrite core from the front side of the ferrite core to a back side of the ferrite core;
- at least two second penetration holes respectively penetrating into the central portion of the ferrite core from the front side of the ferrite core to the back side of the ferrite core; and
- a plate type of metallic terminal in which an electric current flows across the magnetic field induced in the ferrite core, the metallic terminal comprising
  (1) two first internal terminals inserted into the first penetration holes in one-to-one correspondence, the first internal terminals being connected with the chip capacitor at the front side of the ferrite core,
  (2) two second internal terminals inserted into the second penetration holes in one-to-one correspondence, the second internal terminals being connected with the first internal terminals in one-to-one correspondence at the back side of the ferrite core, and
  (3) two external terminals forcibly fitted on both end surfaces of the ferrite core in one-to-one correspondence, the external terminals being connected with the second internal terminals in one-to-one correspondence at the front side of the ferrite core.

In the above configuration, an electric current provided from an external line flows one of the external terminals, one of the second internal terminals connected with one of the external terminals, one of the first internal terminals connected with one of the second internal terminals, the other first internal terminal, the other second internal terminal, and the other external terminal in that order. Also, the chip capacitor is charged by the electric current flowing between the first internal terminals. In this case, because the electric current flows across the magnetic field, the ferrite core with the metallic terminal functions as the noise suppressing filter.

Also, the first and second internal terminals are not made of a film type of wiring network but made of terminals generally utilized. Therefore, a large intensity of electric current can flow through the metallic terminal.

In addition, because the first and second internal terminals are made of the metallic plate, the inductance of the first internal terminals and the inductance of the second internal terminals can be accurately set to a regular value even though the first and second internal terminals are inserted into the first and second penetration holes.

Furthermore, the external terminals are forcibly fitted to the ferrite core. Therefore, the metallic terminal and the ferrite core can reliably function as the noise suppressing filter.

The second object is achieved by the provision of a method for manufacturing a chip type of noise suppressing filter, comprising the steps of:
preparing a rectangular solid shaped ferrite core in which at least two penetration holes respectively penetrating into a central portion of the ferrite core from a front side of the ferrite core to a back side of the ferrite core are provided;
preparing a metallic plate;
punching the metallic plate to produce a metallic hoop in which at least two internal terminals and two external terminals connected with a frame are developed, the external terminals being connected with the internal terminals in one-to-one correspondence;
bending the internal terminals to perpendicularly rise the internal terminals;
bending the external terminals to perpendicularly rise the external terminals and to form an enclosure having a rectangular shape agreeing with the shape of the ferrite core,
forcibly fitting the ferrite core on the metallic hoop surrounded by the enclosure formed of external terminals bent while inserting the internal terminals into the penetration holes from the front side of the ferrite core, tips of the internal terminals which are inserted into the penetration holes projecting over the penetration holes;
bending the tips of the internal terminals projecting over the penetration holes to approach each other at the back side of the ferrite core;
connecting the tips of the internal terminals bent; and
separating the internal terminals and the external terminals from the frame of the metallic hoop.

In the above steps of the method, the chip type of noise suppressing filter comprising the ferrite core, the internal terminals which are inserted into the penetration holes and are connected each other at the back side of the ferric core, and the external terminals which are connected with the internal terminals and are forcibly fitted on both end surfaces of the ferric core is manufactured.

Therefore, because the ferrite core is fitted on the metallic which is bent in advance to form a rectangular shape agreeing with the shape of the ferrite core, the ferrite core can be tightly connected with the external terminals.

Also, because the ferrite core is fitted on the metallic hoop while inserting the internal terminals into the penetration holes, the internal terminals can be easily set in the penetration holes.

It is preferred that the step of bending the tips of the internal terminals include the steps of:
catching the tips of the internal terminals with a drill type of bending tool with spiral grooves;
rotating the bending tool while catching the tips of the internal terminals to bend the internal terminals; and
furthermore bending the internal terminals to approach each other while rotating the bending tool.

In the above steps, the internal terminals can be easily bent. Therefore, the noise suppressing filter can be rapidly manufactured.

Also, the second object is achieved by the provision of a method for manufacturing a chip type of noise suppressing filter, comprising the steps of:
preparing a rectangular solid shaped ferrite core having a groove in which a chip capacitor is put in the groove, and at least two first penetration holes and at least two second penetration holes respectively penetrating into a central portion of the ferrite core from a front side of the ferrite core to a back side of the ferrite core are provided;
preparing a metallic plate;
punching the metallic plate to produce a metallic hoop in which at least two first internal terminals, at least two second internal terminals, and two external terminals connected with a frame are developed, the external terminals being connected with the second internal terminals in one-to-one correspondence;
bending the first and second internal terminals to perpendicularly rise the first and second internal terminals;
bending the external terminals to perpendicularly rise the external terminals and to form an enclosure having a rectangular shape agreeing with the shape of the ferrite core,
forcibly fitting the ferrite core on the metallic hoop surrounded by the enclosure formed of the external terminals bent while inserting the first internal terminals into the first penetration holes from the front side of the ferrite core and while inserting the second internal terminals into the second penetration holes from the front side of the ferrite core, tips of the first and second internal terminals inserted into the first and second penetration holes projecting over the first and second penetration holes;
connecting the first internal terminals with the chip capacitor at the front side of the ferrite core;
bending both the tip of one of the first internal terminals and the tip of one of the second internal terminals to approach each other at the back side of the ferrite core;

connecting both the tip of one of the first internal terminals and the tip of one of the second internal terminals;

bending both the tip of another first internal terminal and the tip of another second internal terminal to approach each other at the back side of the ferrite core;

connecting both the tip of another first internal terminal and the tip of another second internal terminal;

separating the first and second internal terminals and the external terminals from the frame of the metallic hoop.

In the above steps of the method, the chip type of noise suppressing filter comprising the ferrite core, the chip capacitor, the first and second internal terminals which are inserted into the first and second penetration holes, and the external terminals which are forcibly fitted on both end surfaces of the ferric core is manufactured.

Therefore, because the ferrite core is fitted on the metallic which is bent in advance to form a rectangular shape agreeing with the shape of the ferrite core, the ferrite core can be tightly connected with the external terminals.

Also, because the ferrite core is fitted on the metallic hoop while inserting the first and second internal terminals into the first and second penetration holes, the first and second internal terminals can be easily set in the first and second penetration holes.

BRIEF DESCRIPTION OF THE DRAWINGS

The objects, features and advantages of the present invention will be apparent from the following description taken in conjunction with the accompanying drawings, in which:

FIG. 21A is a front view of a noise suppressing filter having an intermediate terminal made of a lead wire;

FIG. 21B is a base view of the noise suppressing filter shown in FIG. 21A;

FIG. 21C is a back view of the noise suppressing filter shown in FIG. 21A;

FIG. 21D is a right side view of the noise suppressing filter shown in FIG. 21A;

FIG. 22A is a front view of a ferrite core utilized for the noise suppressing filter shown in FIGS. 21A to 21D;

FIG. 22B is a base view of the ferrite core shown in FIG. 22A;

FIG. 22C is a back view of the ferrite core shown in FIG. 22A;

FIG. 22D is a right side view of the ferrite core shown in FIG. 22A;

FIG. 23 is a diagonal view partially showing the ferrite core shown in FIGS. 22A to 22D;

FIG. 29A is a plan view of a bent metallic plate obtained by bending the punched metallic plate shown in FIG. 20, according to a first modification of a fifth embodiment;

FIG. 29B is a front view of the bent metallic plate shown in FIG. 29A;

FIG. 29C is a side view of the bent metallic plate shown in FIG. 29A;

DETAIL DESCRIPTION OF THE PREFERRED EMBODIMENTS

Preferred embodiments of a noise suppressing filter and a method for manufacturing the filter according to the present invention are described with reference to drawings.

1. First Embodiment

A chip type of noise suppressing filter in which two internal terminals are arranged in parallel and no chip capacitor is provided is described according to a first embodiment of the present invention with reference to FIGS. 3A to 10.

Figure 1:
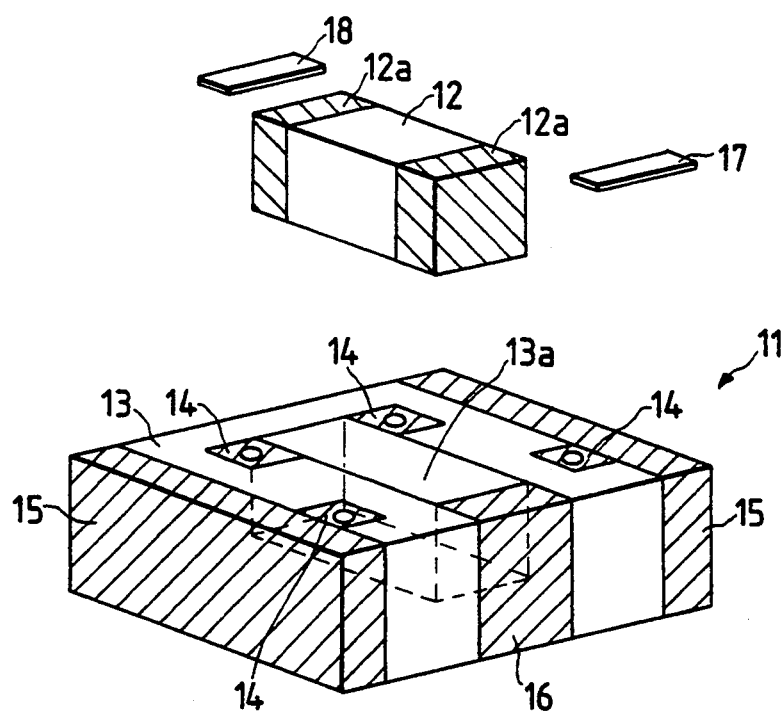
FIG. 1 is an exploded and diagonal view of a conventional noise suppressing filter.
Figure 2:
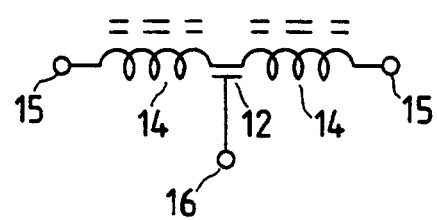
FIG. 2 is an equivalent circuit of the conventional noise suppressing filter shown in FIG. 1.
Figure 3A:
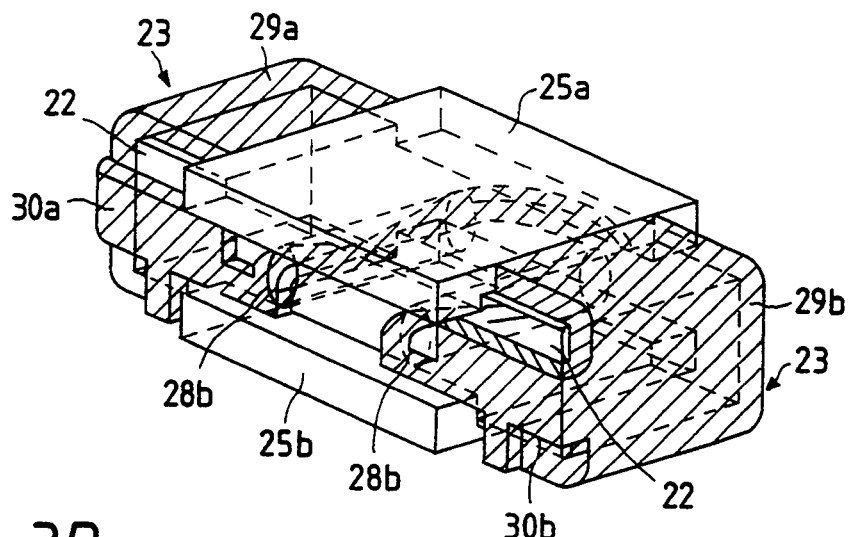
FIG. 3A is a diagonal view perspectively showing a chip type of noise suppressing filter according to a first embodiment of the present invention.
Figure 3B:
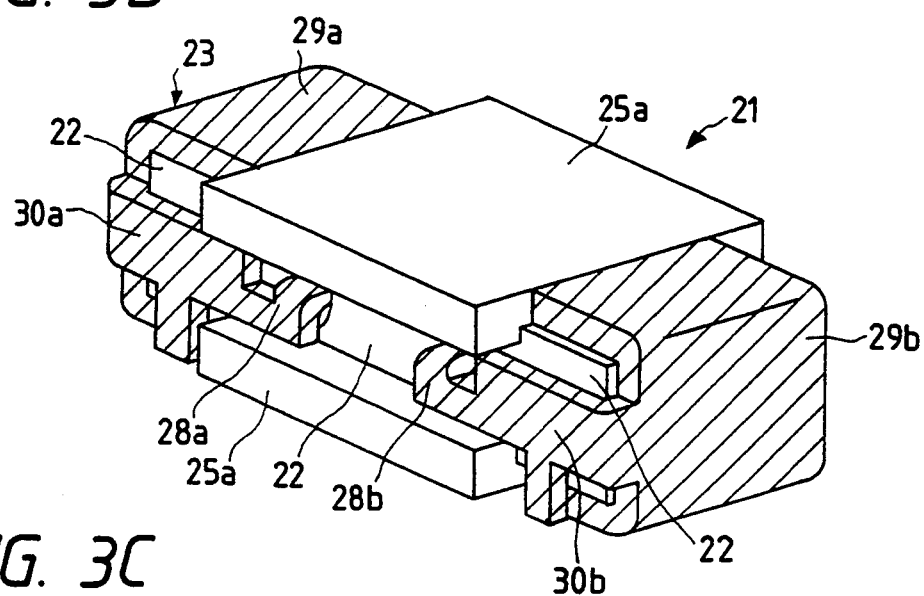
FIG. 3B is a diagonal view showing the chip type of noise suppressing filter shown in FIG. 3A according to the first embodiment of the present invention.
Figure 3C:
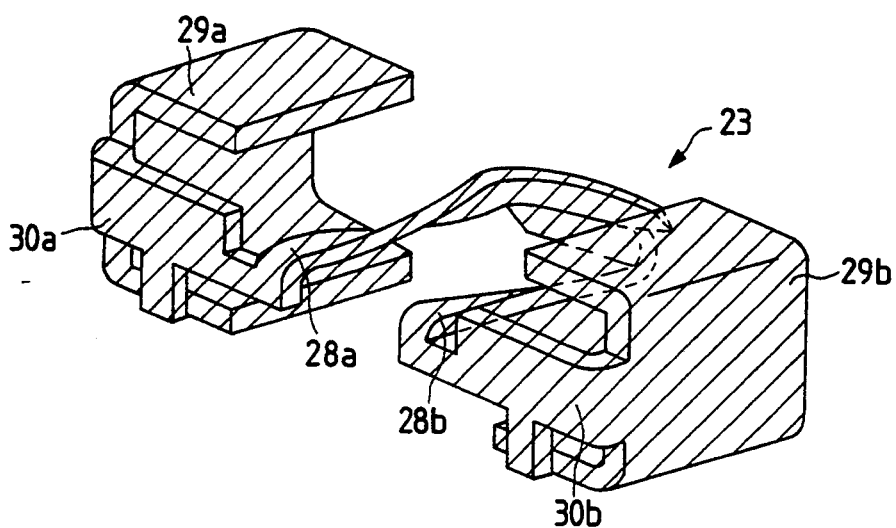
FIG. 3C is a diagonal view of a metallic terminal utilized in the noise suppressing filter shown in FIG. 3A.
Figure 4:
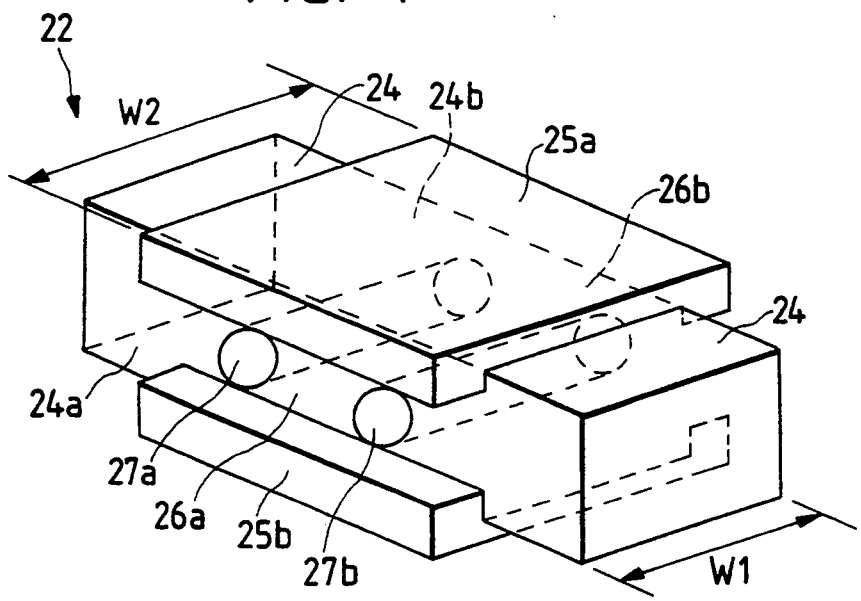
FIG. 4 is a diagonal view of a ferrite core utilized in the noise suppressing filter shown in FIG. 3A.
Figures 5, 7:
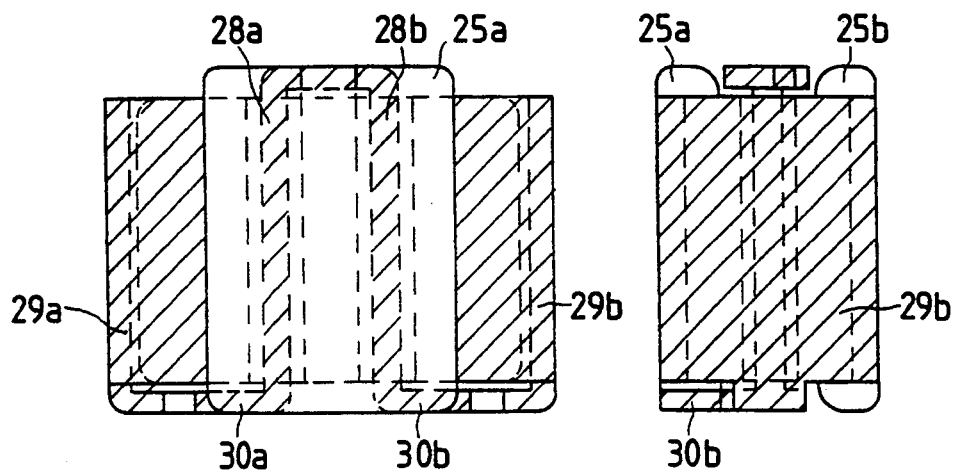
FIG. 5 is a plan view of the noise suppressing filter shown in FIG. 3A.
FIG. 7 is a right side view of the noise suppressing filter shown in FIG. 3A.
Figure 6:
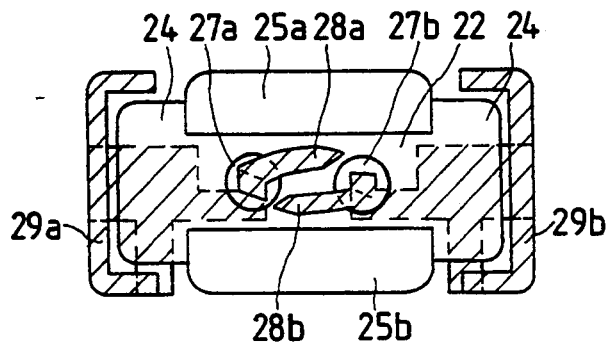
FIG. 6 is a front view of the noise suppressing filter shown in FIG. 3A.
Figure 8:
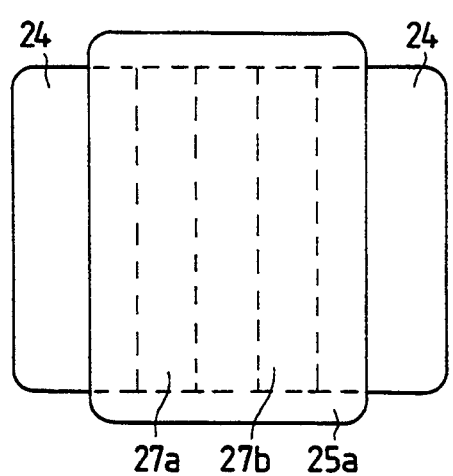
FIG. 8 is a plan view of the ferrite core shown in FIG. 4.
Figure 10:
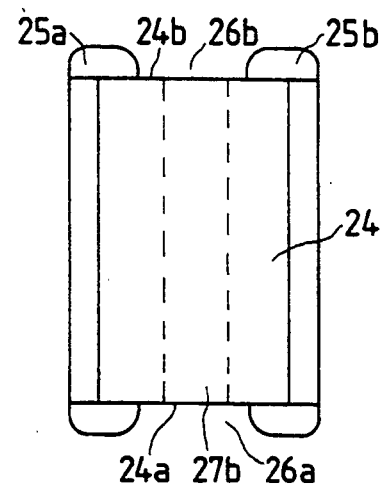
FIG. 10 is a right side view of the ferrite core shown in FIG. 4.
Figure 9:
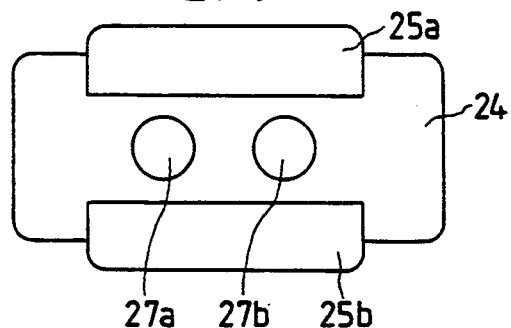
FIG. 9 is a front view of the ferrite core shown in FIG. 4.

FIG. 3A is a diagonal view perspectively showing a chip type of noise suppressing filter according to a first embodiment of the present invention. FIG. 3B is a diagonal view showing the chip type of noise suppressing filter shown in FIG. 3A according to the first embodiment of the present invention. FIG. 3C is a diagonal view of a metallic terminal utilized in the noise suppressing filter shown in FIG. 3A. FIG. 4 is a diagonal view of a ferrite core utilized in the noise suppressing filter shown in FIG. 3A. FIG. 5 is a plan view of the noise suppressing filter shown in FIG. 3A. FIG. 6 is a front view of the noise suppressing filter shown in FIG. 3A. FIG. 7 is a right side view of the noise suppressing filter shown in FIG. 3A. FIG. 8 is a plan view of the ferrite core shown in FIG. 4. FIG. 9 is a front view of the ferrite core shown in FIG. 4. FIG. 10 is a right side view of the ferrite core shown in FIG. 4.

As shown in FIGS. 3, 5, and 7, a chip type of noise suppressing filter 21 comprises an almost rectangular solid shaped ferrite core 22 for inducing a magnetic field, and a metallic terminal 23 arranged on a surface of the ferrite core 22 and arranged in the ferrite core 22 for functioning as a pair of induction coils arranged in series. The metallic terminal 23 is arranged across the magnetic field induced by the ferrite core 22.

As shown in FIGS. 4, 8, 9, and 10, the ferrite core 22 comprises a rectangular solid shaped body portion 24 and a pair of plate shaped support portions 25a, 25b respectively arranged on a central surface of the body portion 24. The body portion 24 has a narrow width W1, and the support portions 25a, 25b have a wide width W2. Therefore, the support portions 25a, 25b of the ferrite core 22 are respectively projected from front and back sides 24a, 24b of the body portion 24 so that a pair of grooves 26a, 26b are formed on the front and back sides 24a, 24b positioned between the support portions 25a, 25b.

The body portion 24 of the ferrite core 22 has a pair of penetration holes 27a, 27b arranged in parallel. Each of the penetration holes 27a, 27b extends from the groove 26a positioned on the front side 24a of the body portion 24 to the other groove 26b positioned on the back side 24b of the body portion 24.

As shown in FIGS. 3A to 3C, the metallic terminal 23 is formed of a metallic plate which is bent according to a punching and bending process described later. In detail, as shown in FIGS. 3, 5, 6, and 7, the metallic terminals 23 comprises a pair of internal terminals 28a, 28b penetrating through the penetration holes 27a, 27b, a pair of external terminals 29a, 29b having a U-shaped cross section and covering both ends of the body portion 24 of the ferrite core 22, and a pair of connecting terminals 30a, 30b arranged at the front side 24a of the body portion 24 for connecting the internal terminals 28a, 28b with the external terminals 29a 29b in the groove 26a. A tip of the internal terminal 28a positioned in the groove 26b are connected with a tip of the internal terminal 28b positioned in the groove 26b. Also, each of the connecting terminals 30a, 30b is connected with an external line (not shown).

Therefore, an induction coil is formed of the internal terminal 28a, and another induction coil is formed of the internal terminals 28b. The induction coils are arranged in series.

Next, a method for manufacturing the noise suppressing filter 21 is briefly described with reference to FIG. 11.

Figure 11:
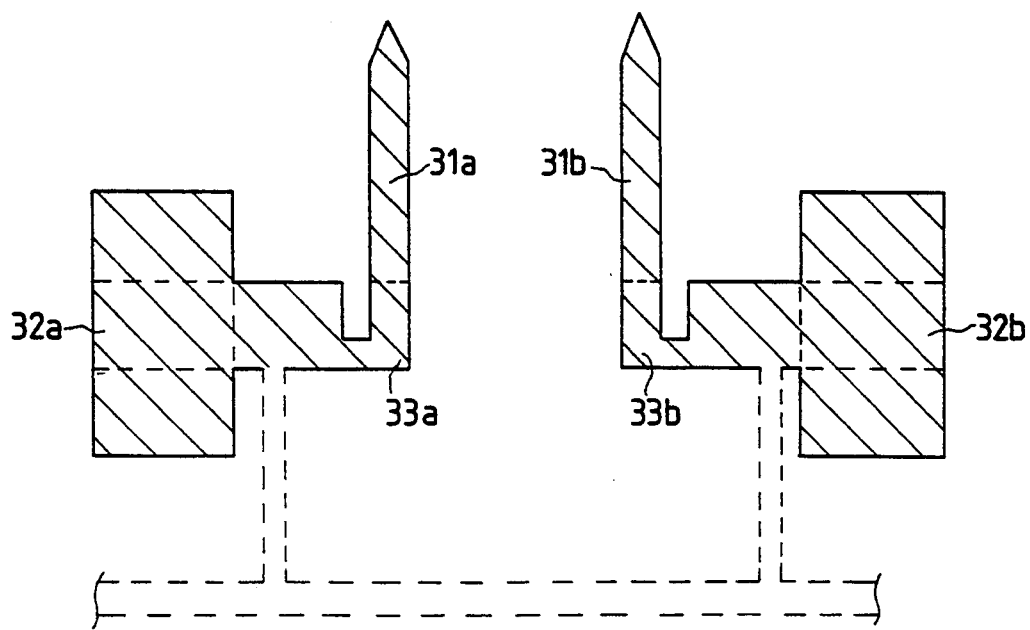
FIG. 11 is a development of the metallic terminal shown in FIG. 3B.

FIG. 11 is a development of the metallic terminal 23 shown in FIG. 3B.

As shown in FIG. 11, a metallic plate is punched in a shape agreeing with a developed view of the metallic terminal 23. Thereafter, a pair of long and narrow top portions 31a, 31b of the metallic plate punched is bent to perpendicularly rise the top portions 31a, 31b so that the internal terminals 28a, 28b are formed of the top portions 31a, 31b perpendicularly risen. Also, a pair of wide base portions 32a, 32b of the metallic plate is bent to perpendicularly rise the wide base portions 32a, 32b so that the external terminals 29a, 29b are formed of the wide base portions 32a, 32b perpendicularly risen.

Thereafter, the ferrite core 22 in which the front side 24a of the body portion 24 is positioned in a bottom direction is arranged on the metallic plate while leading the internal terminals 28a, 28b from the front side 24a of the body portion 24 through the penetration holes 27a, 27b to the back side 24b so as to project the internal terminals 28a, 28b over the penetration holes 27a, 27b. In this case, the external terminals 29a, 29b are stationarily fitted around both ends of the body portion 24. Also, a pair of central portions 33a, 33b is attached to the front side 24a of the body portion 24. Therefore, the connecting terminals 30a, 30b of the metallic terminal 23 are formed of the central portions 33a, 33b attached to the front side 24a of the body portion 24.

Thereafter, the internal terminals 28a, 28b projecting over the penetration holes 28a, 28b are bent to approach each other. Thereafter, the internal terminals 28a, 28b bent are connected with each other in the groove 26b of the sack side 24b of the body portion 24 by applying a cream type of conductive solder. In this case, the connecting terminals 30a, 30b are arranged in the groove 26a, and a width of the external terminals 29a, 29b is equal to the width W2 of the support portions 25a, 25b. Therefore, the noise suppressing filter 21 composed of the ferrite core 22 and the metallic terminal 23 stationarily fitted on tile body portion 24 is finally formed in a rectangular solid shape.

Accordingly, because induction coils formed of the internal terminals 28a, 28b are arranged in series between the external terminals 29a, 29b and because the internal terminals 28a, 28b are made of the metallic plate, a large intensity of electric current can flow through the noise suppressing filter 21. Also, the inductance of each of the internal terminals 28a, 28b can be reliably set to a regular value.

Also, because the external terminals 29a, 29b are stationarily fitted to the ferrite core 22, the external terminals 29a, 29b can be reliably attached to the ferrite core 22.

In addition, because the internal terminals 28a, 28b are arranged in the penetration holes 27a, 27b when the ferrite core 22 is positioned on the metallic plate, the internal terminals 28a, 28b can be easily lead into the penetration holes 27a, 27b.

Accordingly, because the metallic terminals 23 is made in the same manner as chip parts generally utilized, the noise suppressing filter 21 can be easily and reliably manufactured according to the first embodiment.

In the first embodiment, the chip type of noise suppressing filter in which the internal terminals 28a, 28b are arranged in two penetration holes 27a, 27b and no chip capacitor is provided is utilized. However, the number of the penetration holes is not limited to two. That is, it is preferred that the number of the penetration holes be above two.

2. Second Embodiment

Figure 12A:
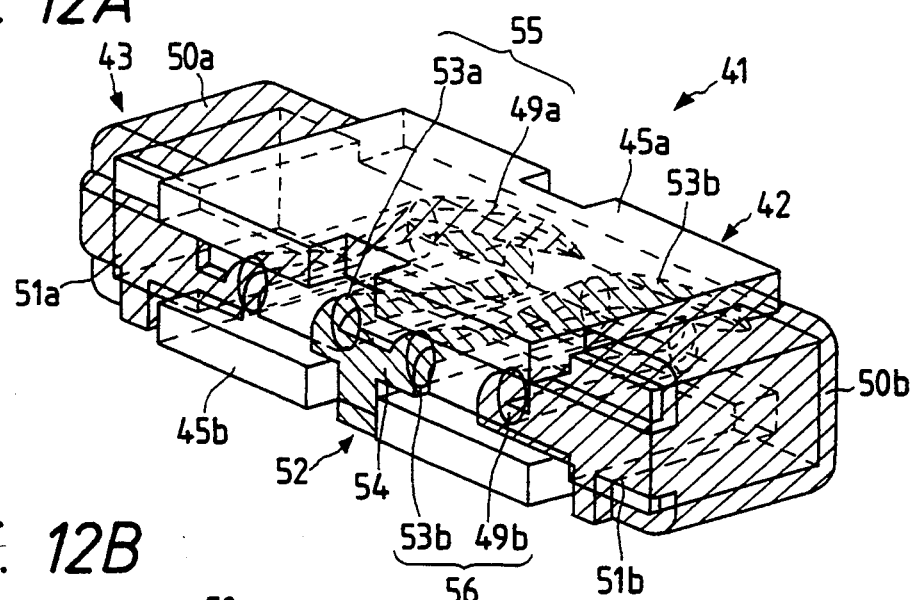
FIG. 12A is a diagonal view perspectively showing a chip type of noise suppressing filter according to a second embodiment of the present invention.
Figure 12B:
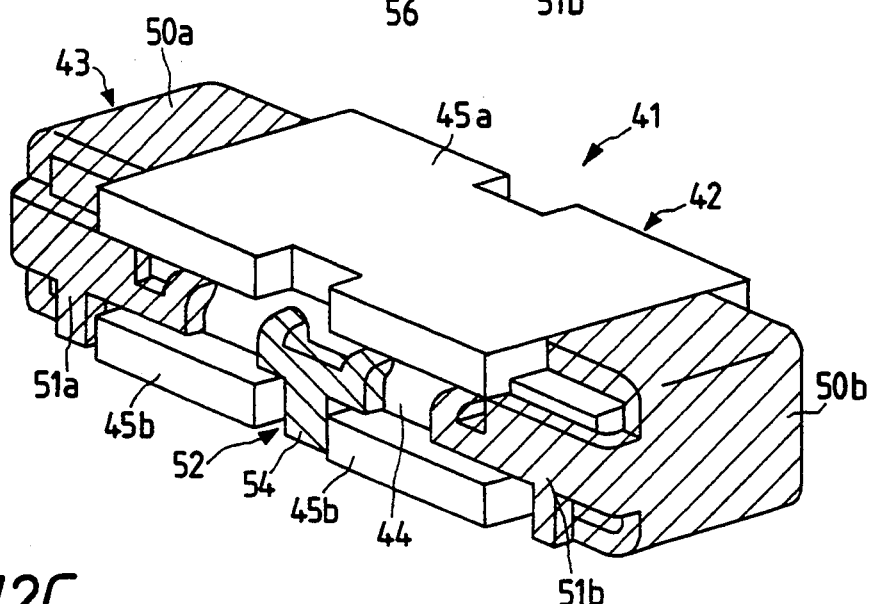
FIG. 12B is a diagonal view showing the chip type of noise suppressing filter shown in FIG. 12A according to the second embodiment of the present invention.
Figure 12C:
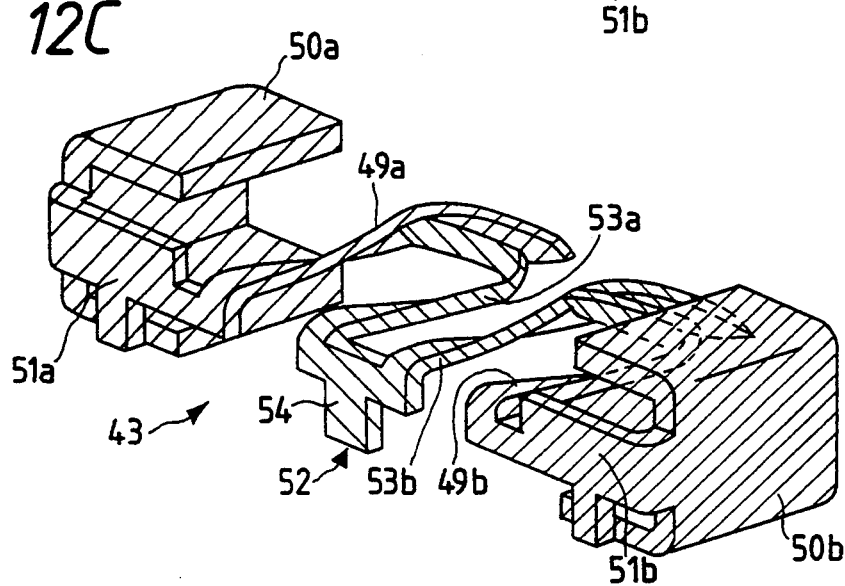
FIG. 12C is a diagonal view of a metallic terminal utilized in the noise suppressing filter shown in FIG. 12A.
Figure 13:
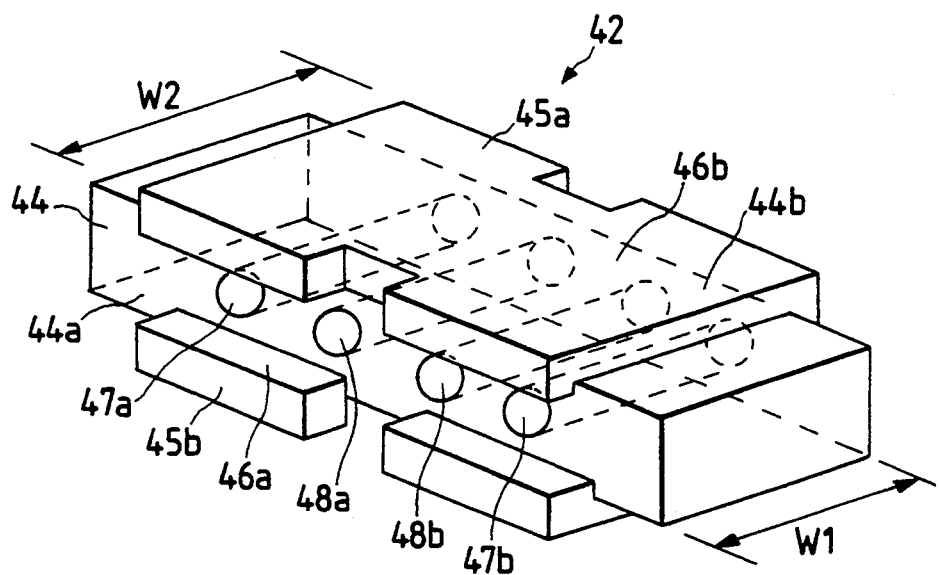
FIG. 13 is a diagonal view of a ferrite core utilized in the noise suppressing filter shown in FIG. 12A.
Figure 14:
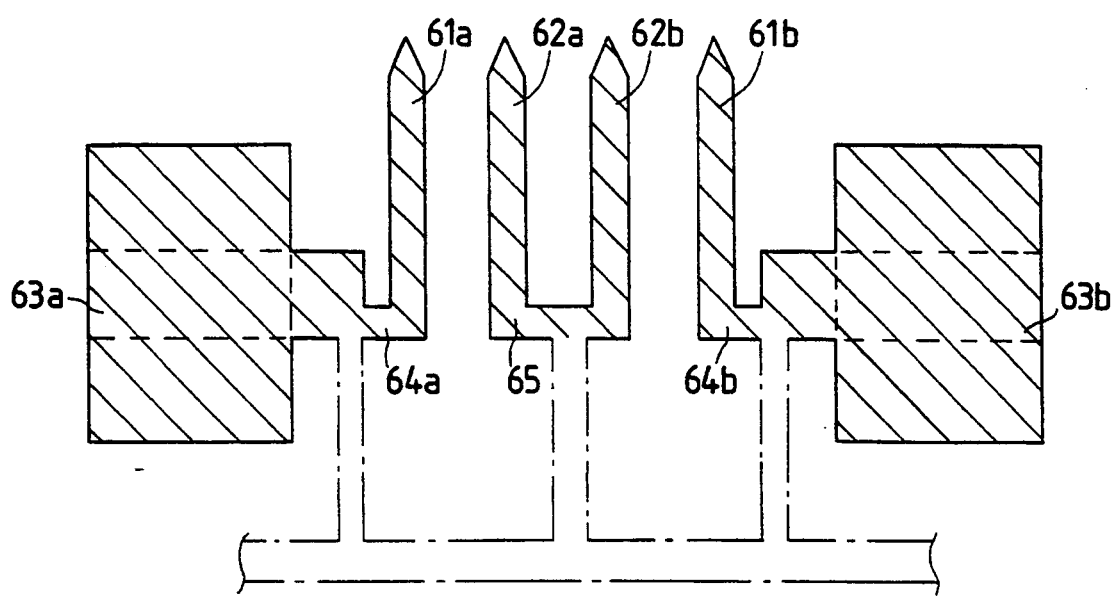
FIG. 14 is a development of a metallic terminal shown in FIG. 12C.

Next, a chip type of noise suppressing filter in which four internal terminals are arranged in parallel and no chip capacitor is provided is described according to a second embodiment of the present invention with reference to FIGS. 12 to 14.

FIG. 12A is a diagonal view perspectively showing a chip type of noise suppressing filter according to a second embodiment of the present invention. FIG. 12B is a diagonal view showing the chip type of noise suppressing filter shown in FIG. 12A according to the second embodiment of the present invention. FIG. 12C is a diagonal view of a metallic terminal utilized in the noise suppressing filter shown in FIG. 12A. FIG. 13 is a diagonal view of a ferrite core utilized in the noise suppressing filter shown in FIG. 12A.

As shown in FIGS. 12A, 12B, a chip type of noise suppressing filter 41 comprises an almost rectangular solid shaped ferrite core 42 for inducing a magnetic field, and a metallic terminal 43 arranged on surfaces of the ferrite core 42 and inserted in the ferrite core 42 for functioning as a pair of induction coils arranged in series.

As shown in FIG. 13, the ferrite core 42 comprises a rectangular solid shaped body portion 44 and a pair of plate shaped support portions 45a, 45b respectively arranged on a central surface of the body portion 44. The body portion 44 has the narrow width W1, and the support portions 45a, 45b have the wide width W2 in the same manner as in the first embodiment. Therefore, the support portions 45a, 45b of the ferrite core 42 are respectively projected from front and back sides 44a, 44b of the body portion 44 so that a pair of grooves 46a, 46b are formed on the front and back sides 44a, 44b positioned between the support portions 45a, 45b.

The body portion 44 of the ferrite core 42 has a pair of outside penetration holes 47a, 47b arranged in parallel. Each of the outside penetration holes 47a, 47b extends from the groove 46a positioned on the front side 44a of the body portion 44 to the other groove 46b positioned on the back side 44b of the body portion 44. In addition, the body portion 44 of the ferrite core 42 further has a pair of inside penetration holes 48a, 48b arranged in parallel with the outside penetration holes 47a, 47b. The inside penetration holes 48a, 48b are positioned between the outside penetration holes 47a, 47b. Therefore, the outside penetration hole 47a, the inside penetration hole 48a, the inside penetration hole 48b, and the inside penetration hole 47b are positioned in that order. Each of the inside penetration holes 48a, 48b extends from the groove 46a positioned on the front side 44a of the body portion 44 to the other groove 46b positioned on the back side 44b of the body portion 44 in the same manner as the outside penetration holes 47a, 47b.

As shown in FIGS. 12A to 12C, the metallic terminal 43 is made of a metallic plate which is bent according to a punching and bending process described later. In detail, the metallic terminal 43 comprises a pair of outside internal terminals 49a, 49b penetrating through the outside penetration holes 47a, 47b, a pair of external terminals 50a, 50b having a U-shaped cross section and covering both end surfaces of the body portion 44 of the ferrite core 42, a pair of connecting terminals 51a, 51b arranged at the front side 44a of the body portion 44 for connecting the outside internal terminals 49a, 49b with the external terminals 50a, 50b, and an intermediate terminal 52 penetrating through the inside penetration holes 48a, 48b. Each of the connecting terminals 51a, 51b is connected with an external line (not shown).

The intermediate terminal 52 comprises a pair of inside internal terminals 53a, 53b penetrating through the inside penetration holes 48a, 48b, and an intermediate external terminal 54 arranged at the front side 44a of the body portion 44 for connecting the inside internal terminal 53a with the inside internal terminal 53b. A tip of the inside internal terminal 53a positioned in the groove 46b is connected with a tip of the outside internal terminal 49a positioned in the groove 46b. Also, a tip of the inside internal terminal 53b positioned in the groove 46b is connected with a tip of the outside internal terminal 49b positioned in the groove 46b.

Therefore, an induction coil 55 is formed of both the inside and outside internal terminals 49a, 53a, and another induction coil 56 arranged in series with the induction coil 55 is formed of both the inside and outside internal terminals 49b, 53b.

Next, a method for manufacturing the noise suppressing filter 41 is described with reference to FIG. 14.

FIG. 14 is a development of the metallic terminal 43 shown in FIG. 12C.

As shown in FIG. 14, a metallic plate is punched in a shape agreeing with a developed view of the metallic terminal 43. Thereafter, a pair of long and narrow outside portions 61a, 61b of the metallic plate punched is bent to perpendicularly rise the outside portions 61a, 61b so that the outside internal terminals 49a, 49b are formed of the outside portions 61a, 61b perpendicularly risen. Also, a pair of long and narrow inside portions 62a, 62b of the metallic plate punched is bent to perpendicularly rise the inside portions 62a, 62b so that the inside internal terminals 52a, 52b are formed of the inside portions 62a, 62b perpendicularly risen.

Thereafter, the ferrite core 42 in which the front side 44a of the body portion 44 is positioned in a bottom direction is arranged on the metallic plate while leading the outside internal terminals 49a, 49b into the outside penetration holes 47a, 47b so as to project the outside internal terminals 49a, 49b over the outside penetration holes 47a, 47b and leading the inside internal terminals 53a, 53b into the inside penetration holes 48a, 48b so as to project the inside internal terminals 53a, 53b over the inside penetration holes 48a, 48b.

Thereafter, wide base portions 63a, 63b of the metallic plate are stationarily fitted around both ends of the body portion 44 while bending the wide base portions 63a, 63b. Therefore, the external terminals 50a, 50b are formed of the wide bottom portions 63a, 63b of the metallic plate stationarily fitted around both ends of the body portion 44. Also, when the wide base portions 63a, 63b are bent, a pair of joint portions 64a, 64b are attached to the front side 44a of the body portion 44. Therefore, the connecting terminals 51a, 51b of the metallic terminal 43 are formed of the joint portions 64a, 64b attached to the front side 44a of the body portion 44. Also, an intermediate portion 65 is attached to the front side 44a of the body portion 44. Therefore, the intermediate external terminal 54 of the metallic terminal 43 are formed of the intermediate portion 65 attached to the front side 44a of the body portion 44.

Thereafter, both the outside internal terminal 49a projecting over the outside penetration hole 47a and the inside internal terminal 53a projecting over the inside penetration hole 48a are bent to approach each other. Thereafter, the internal terminals 49a, 53a bent are connected with each other in the groove 46b arranged at the back side 44b of the body portion 44 by applying a cream type of conductive solder. Also, both the outside internal terminal 49b projecting over the outside penetration hole 47b and the inside internal terminal 53b projecting over the inside penetration hole 48b are bent to approach each other. Thereafter, the internal terminals 49b, 53b bent are connected with each other in the groove 46b arranged at the back side 44b of the body portion 44 by applying a cream type of conductive solder.

In this case, the joint portions 64a, 64b and the intermediate portion 65 are arranged in the groove 46a, and a width of the external terminals 50a, 50b is equal to the width W2 of the support portions 45a, 45b. Therefore, the noise suppressing filter 41 composed of the ferrite core 42 and the metallic terminal 43 stationarily fitted on the body portion 44 is finally formed in a rectangular solid shape.

Accordingly, because induction coils formed of the inside and outside internal terminals 49a, 49b, 53a, 53b are arranged in series between the external terminals 50a, 50b and because the inside and outside internal terminals 49a, 49b, 53a, 53b are made of the metallic plate, a large intensity of electric current can flow through the noise suppressing filter 41. Also, the inductance of each of the internal terminals 49a, 49b, 53a, 53b can be reliably set to a regular value.

Also, because the external terminals 50a, 50b are stationarily fitted to the ferrite core 42, the external terminals 50a, 50b can be reliably attached to the ferrite core 42.

In addition, because the inside and outside internal terminals 49a, 49b, 53a, 53b are arranged in the penetration holes 47a, 47b, 48a, 48b when the ferrite core 42 is positioned on the metallic plate, the inside and outside internal terminals 49a, 49b, 53a, 53b can be easily lead into the penetration holes 47a, 47b, 48a, 48b.

Accordingly, because the metallic terminals 43 is made in the same manner as chip parts generally utilized, the noise suppressing filter 41 can be easily and reliably manufactured according to the second embodiment.

3. Third Embodiment

Next, a chip type of noise suppressing filter in which four internal terminals are arranged in parallel and a chip capacitor is provided is described according to a third embodiment of the present invention with reference to FIGS. 15 to 20.

Figure 15A:
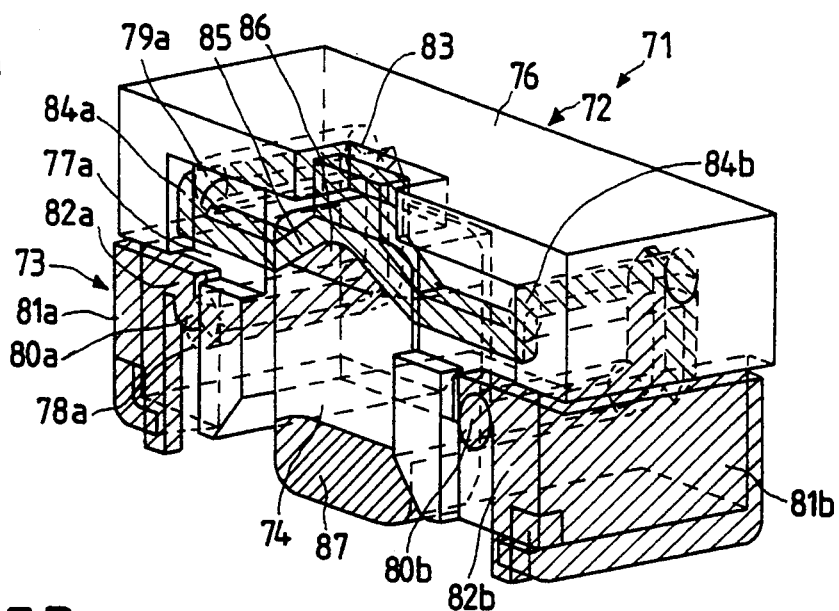
FIG. 15A is a diagonal view perspectively showing a chip type of noise suppressing filter according to a third embodiment of the present invention.
Figure 15B:
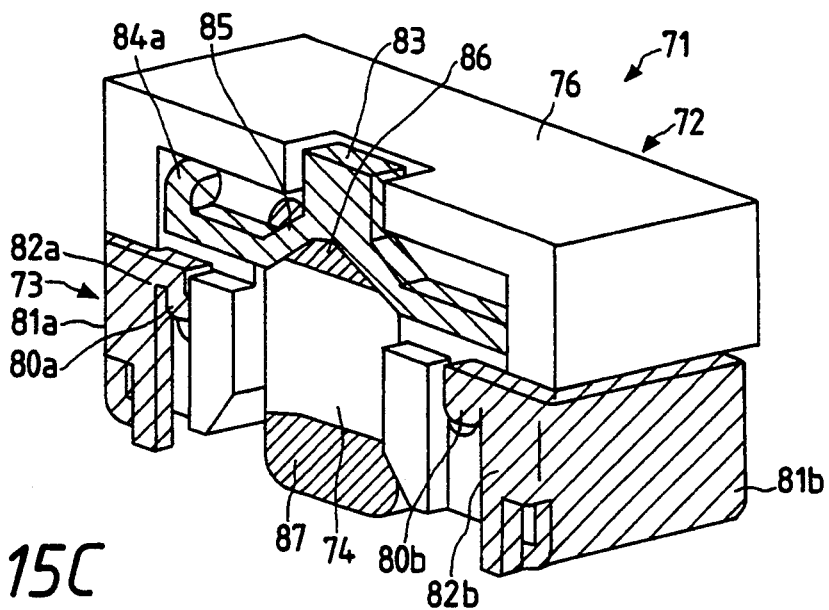
FIG. 15B is a diagonal view showing the chip type of noise suppressing filter shown in FIG. 15A according to the thirdembodiment of the present invention.
Figure 15C:
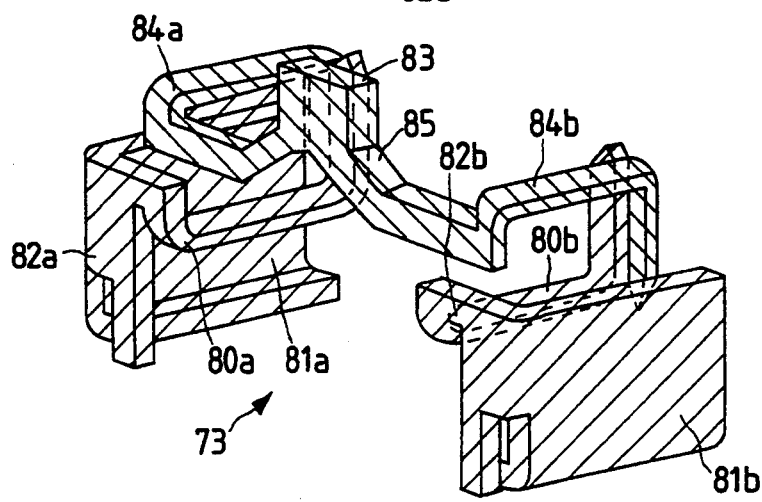
FIG. 15C is a diagonal view of a metallic terminal utilized in the noise suppressing filter shown in FIG. 15A.
Figure 16:
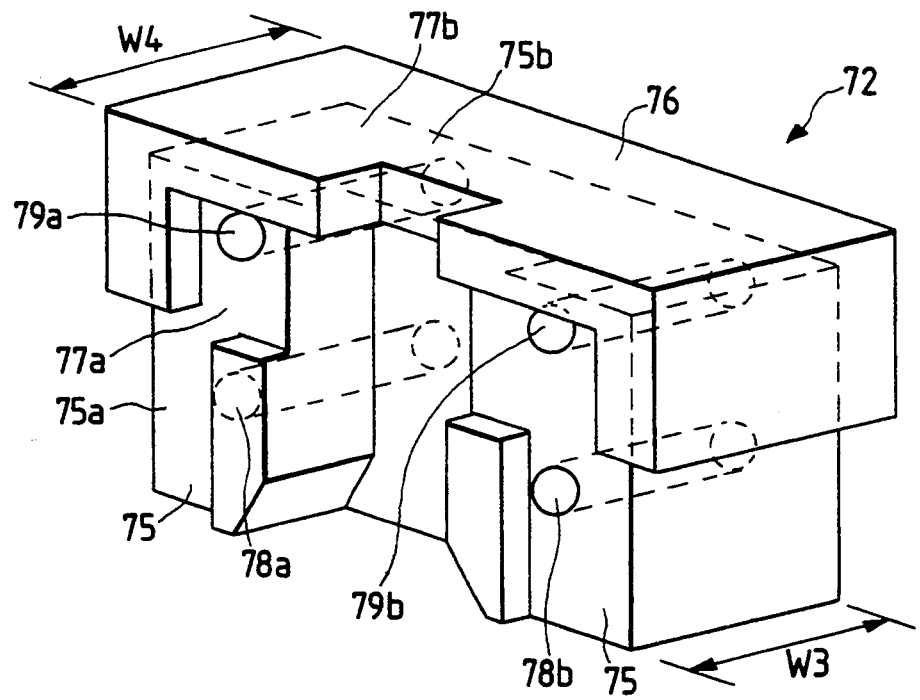
FIG. 16 is a diagonal view of a ferrite core utilized in the noise suppressing filter shown in FIG. 15A.
Figure 17:
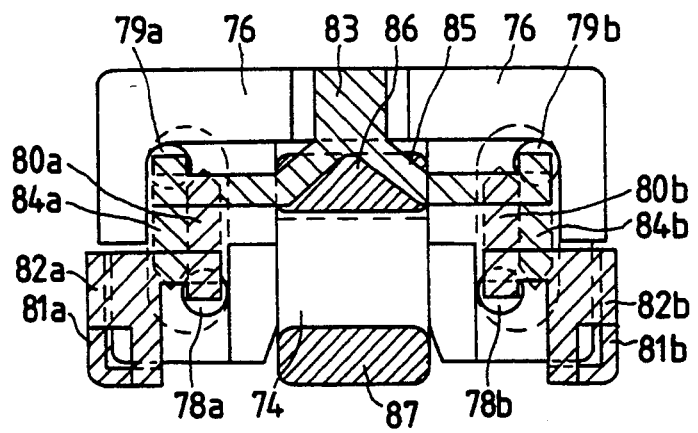
FIG. 17 is a front view of the noise suppressing filter shown in FIG. 15A.
Figure 19:
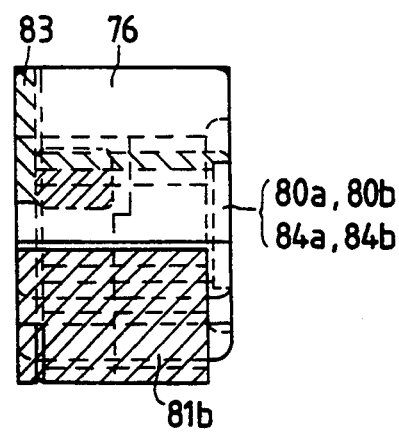
FIG. 19 is a right side view of the noise suppressing filter shown in FIG. 15A.
Figure 18:
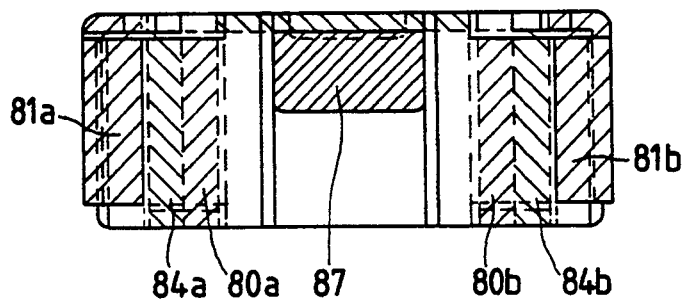
FIG. 18 is a base view of the noise suppressing filter shown in FIG. 15A.

FIG. 15A is a diagonal view perspectively showing a chip type of noise suppressing filter according to a third embodiment of the present invention. FIG. 15B is a diagonal view showing the chip type of noise suppressing filter shown in FIG. 15A according to the thirdembodiment of the present invention. FIG. 15C is a diagonal view of a metallic terminal utilized in the noise suppressing filter shown in FIG. 15A. FIG. 16 is a diagonal view of a ferrite core utilized in the noise suppressing filter shown in FIG. 15A. FIG. 17 is a front view of the noise suppressing filter shown in FIG. 15A. FIG. 18 is a base view of the noise suppressing filter shown in FIG. 15A. FIG. 19 is a right side view of the noise suppressing filter shown in FIG. 15A.

As shown in FIGS. 15A, 15B, a chip type of noise suppressing filter 71 comprises an almost rectangular solid shaped ferrite core 72 having a groove in the center thereof for inducing a magnetic field, a metallic terminal 73 arranged on surfaces of the ferrite core 72 and inserted in the ferrite core 72 for functioning as a pair of induction coils arranged in series, and a chip capacitor 74 arranged in the groove of the ferrite core 72 for holding charges.

As shown in FIG. 16, the ferrite core 72 comprises a rectangular solid shaped body portion 75 and a plate shaped roof portion 76 arranged on the body portion 75. The body portion 75 has a narrow width W3, and the roof portion 76 has a wide width W4. Therefore, the roof portion 76 of the ferrite core 72 is projected from front and back sides 75a, 75b of the body portion 75 so that a pair of hollow portions 77a, 77b are formed on the front and back sides 75a, 75b of the body portion 75.

The body portion 75 of the ferrite core 72 has a pair of downside penetration holes 78a, 78b arranged in parallel. Each of the downside penetration holes 78a, 78b extends from the hollow portion 77a positioned on the side 75a of the body portion 75 to the other hollow portion 77b positioned on the back side 75b of the body portion 75. In addition, the body portion 75 of the ferrite core 72 further has a pair of upside penetration holes 79a, 79b arranged in parallel with the downside penetration holes 78a, 78b. The upside penetration holes 79a, 79b are positioned just above the downside penetration holes 78a, 78b. Each of the upside penetration holes 79a, 79b extends from the hollow portion 77a positioned on the front side 75a of the body portion 75 to the other hollow portion 77b positioned on the back side 75b of the body portion 75 in the same manner as the downside penetration holes 78a, 78b.

As shown in FIGS. 15A to 15C, the metallic terminal 73 is made of a metallic plate which is bent according to a punching and bending process described later. In detail, the metallic terminal 73 comprises a pair of downside internal terminals 80a, 80b penetrating through the downside penetration holes 78a, 78b, a pair of external terminals 81a, 81b having a U-shaped cross section and covering both end surfaces of the body portion 75 of the ferrite core 72, a pair of connecting terminals 82a, 82b arranged at the front side 75a of the body portion 75 for connecting the downside internal terminals 80a, 80b with the external terminals 81a, 81b, and an intermediate terminal 83 penetrating through the upside penetration holes 79a, 79b. Each of the connecting terminals 82a, 82b is connected with an external line (not shown).

The intermediate terminal 83 comprises a pair of upside internal terminals 84a, 84b penetrating through the upside penetration holes 79a, 79b, and an intermediate external terminal 85 arranged at the front side 75a of the body portion 75 and formed in a Y shape for connecting the upside internal terminal 84a with the upside internal terminal 84b. A tip of the upside internal terminal 84a positioned in the hollow portion 77b is connected with a tip of the downside internal terminal 80a positioned in the hollow portion 77b. Also, a tip of the upside internal terminal 84b positioned in the hollow portion 77b is connected with a tip of the downside internal terminal 80b positioned in the hollow portion 77b.

The chip capacitor 74 is provided with upper and lower electrodes 86, 87 at ends thereof. The upper electrode 86 is arranged between the body portion 75 of the ferrite core 72 and the intermediate external terminal 85 and is soldered to the intermediate external terminal 85. The lower electrode 87 is arranged at the bottom of the groove of the ferrite core 72. In this case, the bottom of the lower electrode 87 is positioned on a level with the bottoms of the connecting terminals 82a, 82b. Also, the lower electrode 87 is electrically connected with an external line.

Therefore, an induction coil 88 is formed of both the upside and downside internal terminals 80a, 84a, and another induction coil 89 arranged in series with the induction coil 88 is formed of both the upside and downside internal terminals 80b, 84b. Also, the chip capacitor 74 electrically connected with the external line is electrically connected with the intermediate external terminal 85 with which the induction coils 88, 89 are connected.

Next, a method for manufacturing the noise suppressing filter 71 is described with reference to FIG. 20.

Figure 20:
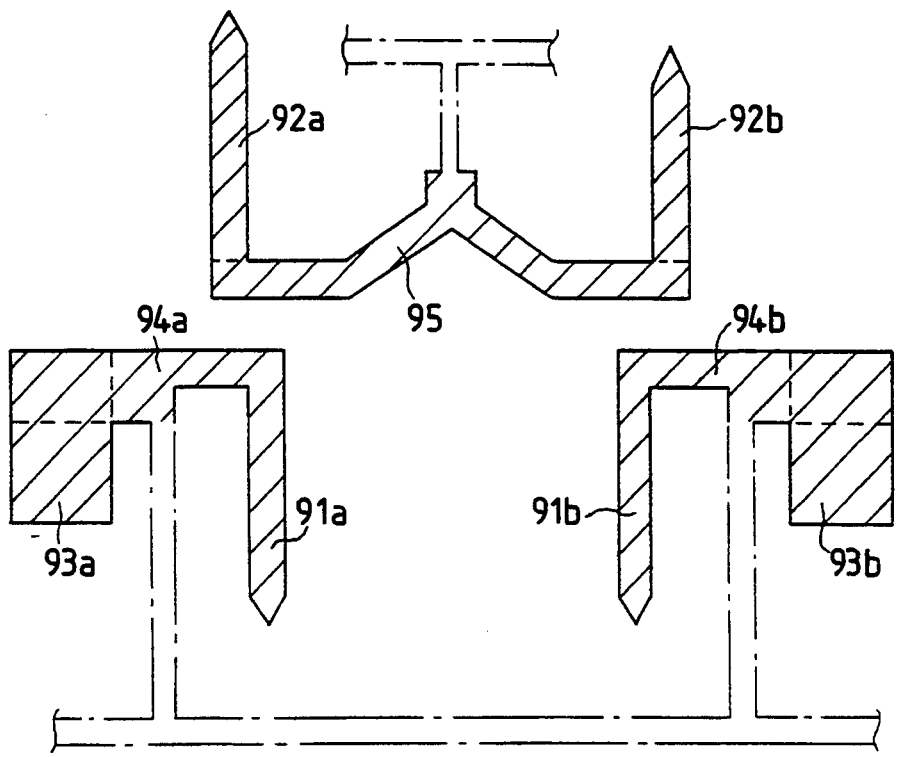
FIG. 20 is a development of a metallic terminal shown in FIG. 15C.

FIG. 20 is a development of the metallic terminal shown in FIG. 15C.

A metallic plate is punched in a shape agreeing with a developed view of the metallic terminal 73 to produce a punched metallic plate shown in FIG. 20. Thereafter, a pair of long and narrow downside portions 91a, 91b of the punched metallic plate is bent to perpendicularly rise the downside portions 91a, 91b so that the downside internal terminals 80a, 80b are formed of the downside portions 91a, 91b perpendicularly risen. Also, a pair of long and narrow upside portions 92a, 92b of the punched metallic plate is bent to perpendicularly rise the upside portions 92a, 92b so that the upside internal terminals 84a, 84b are formed of the upside portions 92a, 92b perpendicularly risen. In addition, a pair of wide base portions 93a, 93b of the punched metallic plate is bent to perpendicularly rise the wide base portions 93a, 93b so that the external terminals 81a, 81b are formed of the wide bottom portions 93a, 93b.

Thereafter, the chip capacitor 74 is stationarily put in the groove of the ferrite core 72, and the front side 75a of the body portion 75 in the ferrite core 72 is positioned in a bottom direction. Also, a cream type of conductive solder is applied on the upper electrode 86 of the chip capacitor 74.

Thereafter, the ferrite core 72 with the chip capacitor 74 is put on the metallic plate while leading the downside internal terminals 80a, 80b into the downside penetration holes 78a, 78b so as to project the downside internal terminals 80a, 80b over the downside penetration holes 78a, 78b and leading the upside internal terminals 84a, 84b into the upside penetration holes 79a, 79b so as to project the upside internal terminals 84a, 84b over the upside penetration holes 79a, 79b. In this case, the external terminals 81a, 81b are stationarily fitted around both ends of the body portion 75. Also, a pair of joint portions 94a, 94b are attached to the front side 75a of the body portion 75. Therefore, the connecting terminals 82a, 82b of the metallic terminal 73 are formed of the joint portions 94a, 94b attached to the front side 75a of the body portion 75. In addition, an intermediate portion 95 is attached to the upper electrode 86 of the chip capacitor 74 on which the cream type of conductive solder is applied. Therefore, the intermediate external terminal 85 of the metallic terminal 73 are formed of the intermediate portion 95 attached to the upper electrode 86 of the chip capacitor 74.

Thereafter, both the downside internal terminal 80a projecting over the downside penetration hole 78a and the upside internal terminal 84a projecting over the upside penetration hole 79a are bent to approach each other. Thereafter, the internal terminals 80a, 84a bent are connected with each other in the hollow portion 77b arranged at the back side 75b of the body portion 75 by applying a cream type of conductive solder. Also, both the downside internal terminal 80b projecting over the downside penetration hole 78b and the upside internal terminal 84b projecting over the upside penetration hole 79b are bent to approach each other. Thereafter, the internal terminals 80b, 84b bent are connected with each other in the hollow portion 77b arranged at the back side 75b of the body portion 75 by applying a cream type of conductive solder.

In this case, the joint portions 94a, 94b and the intermediate portion 95 are arranged in the hollow portion 77a, and a width of the external terminals 81a, 81b is equal to the width W4 of the roof portion 76 of the ferrite core 72. Therefore, the noise suppressing filter 71 composed of the ferrite core 72, the chip capacitor 74, and the metallic terminal 73 stationarily fitted on the body portion 75 is finally formed in a rectangular solid shape.

Accordingly, because induction coils formed of the upside and downside internal terminals 80a, 80b, 84a, 84b are arranged in parallel between the external terminals 81a, 81b and because the upside and downside internal terminals 80a, 80b, 84a, 84b are made of the metallic plate, a large intensity of electric current can flow through the noise suppressing filter 71. Also, the inductance of each of the internal terminals 80a, 80b, 84a, 84b can be reliably set to a regular value.

Also, because the external terminals 81a, 81b are stationarily fitted to the ferrite core 72, the external terminals 81a, 81b can be reliably attached to the ferrite core 72.

In addition, because the upside and downside internal terminals 80a, 80b, 84a, 84b are arranged in the penetration holes 78a, 78b, 79a, 79b when the ferrite core 72 is positioned on the metallic plate, the upside and downside internal terminals 80a, 80b, 84a, 84b can be easily lead into the penetration holes 78a, 78b, 79a, 79b.

Accordingly, because the metallic terminal 73 is made in the same manner as chip parts generally utilized, the noise suppressing filter 71 can be easily and reliably manufactured according to the third embodiment.

In the above embodiment, the intermediate terminal 83 is made of the metallic plate. However, as shown in FIGS. 21A to 21D, it is preferred that an intermediate terminal 96 made of a lead wire be utilized in place of the intermediate terminal 83. In this case, the intermediate terminal 96 is bent on the upper electrode 86 of the chip capacitor 74 in a V shape. Therefore, conductive solder applied between the upper electrode 86 and the intermediate terminal 96 can be prevented from dropping. Also, a noise suppressing filter with the intermediate terminal 96 can be cheaply manufactured as compared with the noise suppressing filter 71 with the intermediate terminal 83.

In addition, it is preferred that the ferrite core 72 be sticked to the external terminals 81a, 81b by an adhesive resin. In this case, as shown in FIGS. 21 to 23, the noise suppressing filter with the intermediate terminal 96 is provided with adhesive resin holders 97 on side surfaces of the ferrite core 72. The adhesive resin holders 97 are provided to prevent the adhesive resin applied on side surfaces of the ferrite core 72 from dropping out along the side surfaces of the ferrite core 72. That is, even though the adhesive resin applied on the ferrite core 72 is dropped along the side surfaces of the ferrite core 72, the adhesive resin dropped is held in the adhesive resin holders 97 so that the adhesive resin held in the adhesive resin holders 97 is solidified to stick the external terminals 81a, 81b to the ferrite core 72.

Accordingly, the adhesive strength between the ferrite core 72 and the external terminals 81a, 81b is enhanced by the adhesive resin holder 97.

4. Fourth Embodiment

Next, a method for manufacturing the chip type of noise suppressing filter 21 shown in FIG. 3A is described in detail.

FIGS. 24A to 24E show steps of a method for manufacturing the chip type of noise suppressing filter 21 shown in FIG. 3A.

Figure 24A:
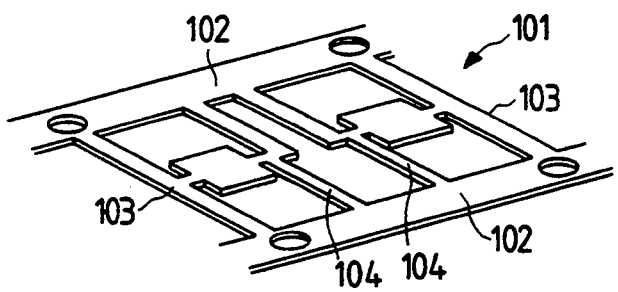
FIGS. 24A to 24E show steps of a method for manufacturing the chip type of noise suppressing filter shown in FIG. 3A, according to a fourth embodiment of the present invention.

As shown in FIG. 24A, a metallic material is punched to produce a metallic hoop 101. In this case, the top portions 31a, 31b shown in FIG. 11 are integrally formed with a main frame 102 of the metallic hoop 101, the wide base portions 32a, 32b shown in FIG. 11 are integrally formed with a sub frame 103 of the metallic hoop 101, and the central portions 33a, 33b shown in FIG. 11 are integrally formed with the main frame 101 through small branches 104 of the metallic hoop 101.

Thereafter, as shown in FIG. 11, the top portions 31a, 31b are taken off from the main frame 102, and the wide base portions 32a, 32b are taken off from the sub frame 103.

Figure 24B:
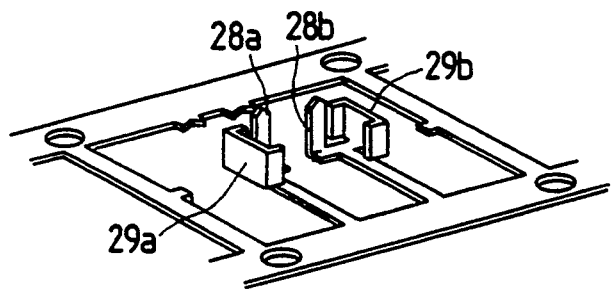

Thereafter, as shown in FIG. 24B, the top portions 31a, 31b and the wide base portions 32a, 32b are perpendicularly risen so that the internal terminals 28a, 28b are formed. In addition, the wide base portions 32a, 32b perpendicularly risen are bent to form an enclosure having a rectangular shape agreeing with the shape of the ferrite core 22 shown in FIG. 4 so that the external terminals 29a, 29b are formed.

Figure 24C:
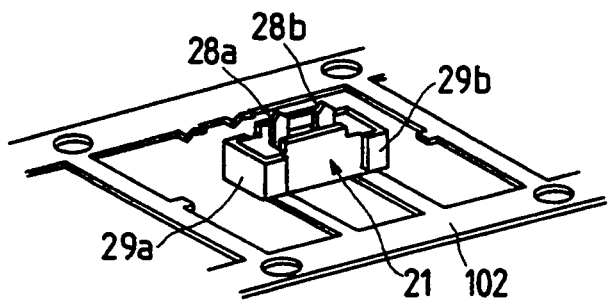

Thereafter, as shown in FIG. 24C, the ferrite core 22 is forcibly put on the central portions 33a, 33b surrounded by the enclosure formed of the external terminals 29a, 29b. In this case, the internal terminals 28a, 28b pass through the penetration holes 27a, 27b, and tips 105a, 105b of the internal terminals 28a, 28b are projected over the penetration holes 27a, 27b.

Figure 24D:
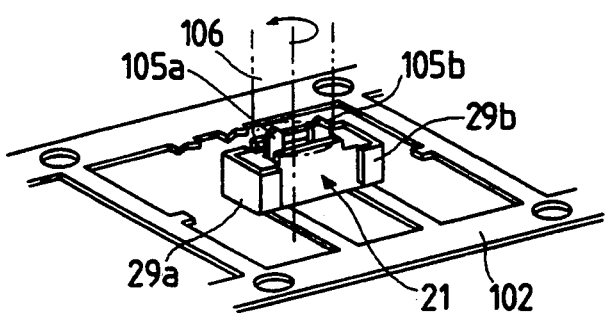
Figure 25:
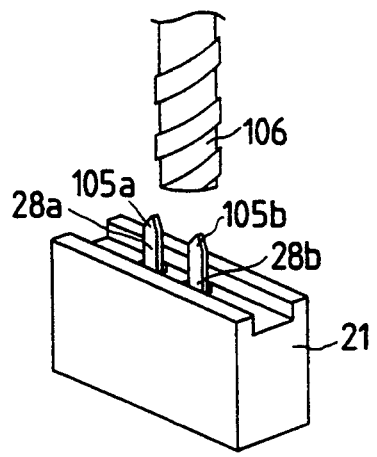
FIG. 25 is a diagonal view of a bending tool according to a first modification of the fourth embodiment, showing a positional relationship between the bending tool and the internal terminals inserted in the ferrite core shown in FIG. 3A.

Thereafter, as shown in FIG. 24D, the tips 105a, 105b of the internal terminals 28a, 28b projected over the penetration holes 27a, 27b are bent to approach each other. In this case, as shown in FIG. 25, the tips 105a, 105b of the internal terminals 28a, 28b are simultaneously bent by a drill type of bending tool 106. The bending tool 106 is provided with spiraled grooves, and a leading edge of the bending tool 106 is flat.

A bending process executed by utilizing the bending tool 106 is described in detail with reference to FIGS. 26A to 26D.

FIGS. 26A to 26D are plan views of the internal terminals 28a, 28b projected over the penetration holes 27a, 27b of the ferrite core 22, showing a bending process for bending the tips 105a, 105b of the internal terminals 28a, 28b by utilizing the bending tool shown in FIG. 25.

Figure 26A:
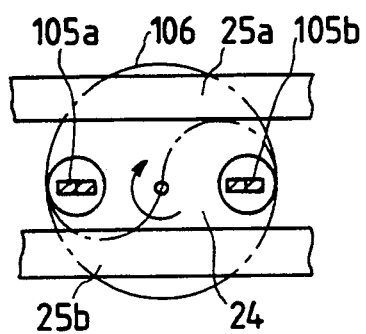
FIGS. 26A to 26D are plan views of internal terminals projected over penetration holes of the ferrite core shown in FIG. 4, showing a bending process for bending tips of the internal terminals by utilizing the bending tool shown in FIG. 25.
Figure 26B:
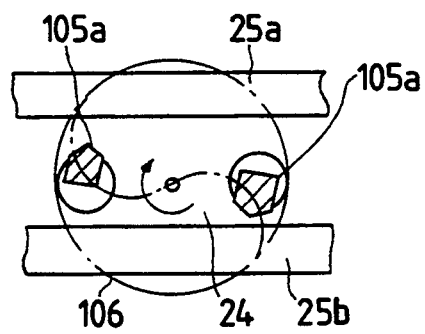

As shown in FIG. 26A, the bending tool 106 is put between the internal terminals 28a, 28b. In this case, because the tips 105a, 105b of the internal terminals 28a, 28b are tapered off, screw threads of the bending tool 106 easily come into contact with the tips 105a, 105b of the internal terminals 28a, 28b. Thereafter, as shown in FIG. 26B, when the bending tool 106 is rotated, the tips 105a, 105b of the internal terminals 28a, 28b are bent towards the support portions 25a, 25b of the ferrite core 22 because the tips 105a, 105b of the internal terminals 28a, 28b are caught by the bending tool 106.

Figure 26C:
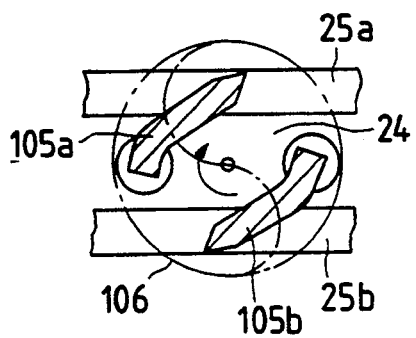

Thereafter, as shown in FIG. 26C, when the bending tool 06 is furthermore rotated, the tips 105a, 105b of the internal terminals 28a, 28b caught by the bending tool 106 are furthermore bent so that the internal terminals 28a, 28b are bent. Therefore, the tips 105a, 105b of the internal terminals 28a, 28b are in contact with the support portions 25a, 25b, and the tips 105a, 105b of the internal terminals 28a, 28b are furthermore bent along the support portions 25a, 25b because the tips 105a, 105b of the internal terminals 28a, 28b are tapered off. That is, the tips 105a, 105b of the internal terminals 28a, 28b are lead by the support portions 25a, 25b.

Figure 26D:
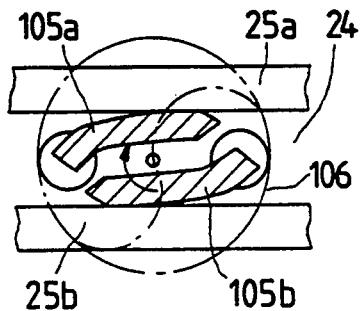

Finally, as shown in FIG. 26D, the internal terminals 28a, 28b are bent in parallel.

Figure 24E:
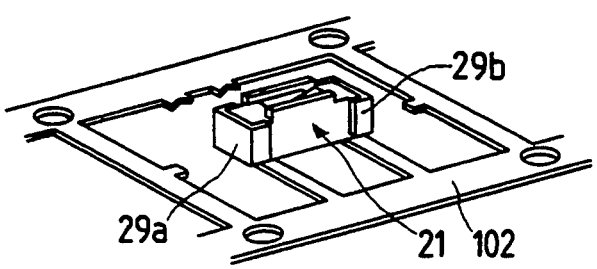

Thereafter, as shown in FIG. 24E, a cream type of conductive solder is applied on the internal terminals 28a, 28b bent in parallel. Thereafter, the solder applied on the internal terminals 28a, 28b is melted by irradiating the solder with a beam of light or a laser beam. In this case, the solder applied on the internal terminals 28a, 28b is locally melted. Thereafter, the solder is cooled so that the internal terminals 28a, 28b are electrically connected.

In this case, it is preferred that the solder be gradually heated by preliminarily irradiating the solder with the beam of which a focus distance is varied. After the solder is preliminarily heated, the solder is heated at a high temperature. Therefore, bubbles generated by rapidly heating the solder are not generated.

Thereafter, the metallic terminal 23 shown in FIG. 24E is taken out of the main frame 102 by cutting out the small branches 104. Therefore, the noise suppressing filter 21 shown in FIG. 3A can be obtained.

Accordingly, because the internal terminals 28a, 28b projecting over the penetration holes 27a, 27b can be easily bent by the bending tool 106 and because the internal terminals 28a, 28b bent can be reliably connected by applying the conductive solder, the noise suppressing filter 21 can be easily manufactured.

In the above embodiment, the drill type of bending tool 106 is utilized. However, as shown in FIGS. 27A, 27B, it is preferred that a plate type of bending tools 107A, 107B having acute-angled tips be utilized to bend the tips 195a, 105b of the internal terminals 28a, 28b, in place of the bending tool 106.

Figure 27A:
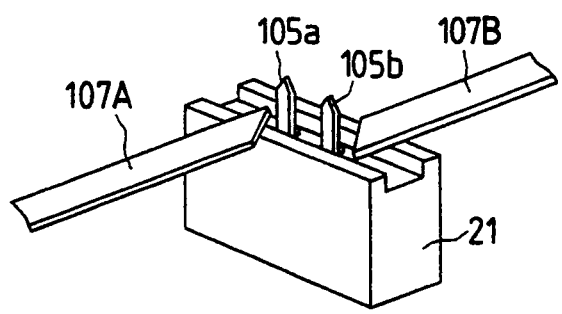
FIG. 27A is a diagonal view of bending tools according to a second modification of the fourth embodiment, showing a positional relationship between the bending tools and the internal terminals inserted in the ferrite core shown in FIG. 3A.
Figure 27B:
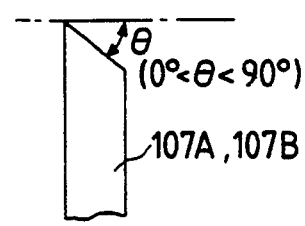
FIG. 27B explanatorily shows tips of the bending tools shown in FIG. 27A.
Figure 28A:
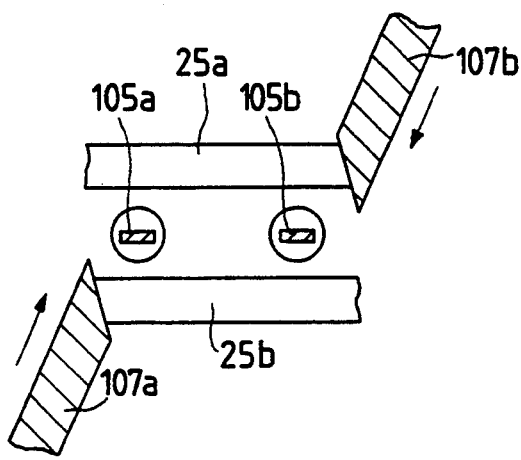
FIGS. 28A to 28D are plan views of internal terminals projected over penetration holes of a ferrite core shown FIG. 4, showing a bending process for bending tips of the internal terminals by utilizing the bending tool shown in FIG. 27A.
Figure 28B:
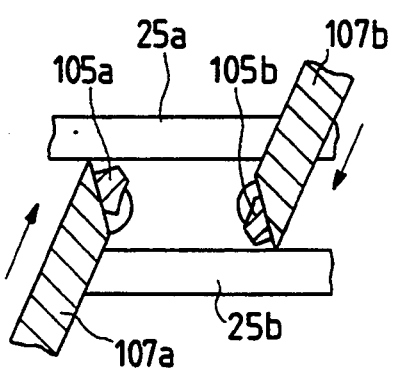
Figure 28C:
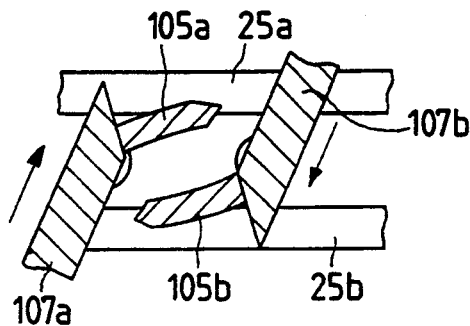
Figure 28D:
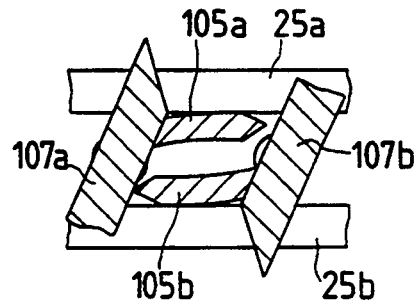

In this case, as shown in FIGS. 27A, 28A, the bending tools 107A, 107B are initially set 180 degrees opposite each other. Thereafter, as shown in FIG. 28B, the tips 105a, 105b of the internal terminals 28a, 28b are pushed by the bending tools 107A, 107B. In this case, because the bending tools 107A, 107B have the acute-angled tips, the tips 105a, 105b of the internal terminals 28a, 28b are bent to approach each other in parallel, as shown in FIG. 28C. Finally, the tips 105a, 105b of the internal terminals 28a, 28b are approached each other in parallel as shown in FIG. 28D.

5. Fifth Embodiment

Next, a method for manufacturing the chip type of noise suppressing filter 71 shown in FIG. 15 is described in detail according to a fifth embodiment of the present invention with reference to FIGS. 29, 30.

FIG. 29A is a plan view of a bent metallic plate obtained by bending the punched metallic plate shown in FIG. 20, according to a first modification of the fifth embodiment. FIG. 29B is a front view of the bent metallic plate shown in FIG. 29A. FIG. 29C is a side view of the bent metallic plate shown in FIG. 29A.

As shown in FIGS. 29A to 29C, a developed terminal obtained by developing the metallic terminal 73 shown in FIG. 15C is produced in the same direction as an extending direction of the sub frame 103. Thereafter, the downside portions 91a, 91b, the upside portions 92a, 92b, and the wide base portions 93a, 93b of the metallic plate shown in FIG. 20 are bent to perpendicularly rise those portions. Thereafter, the ferrite core 72 with the chip capacitor 74 is forcibly fitted into the metallic terminal 73 in the same manner as the ferrite core 21 shown in FIGS. 24A to 24E. Also, the downside and upside internal terminals 80a, 84a are connected with each other according to the bending process shown in FIGS. 25, 26. In addition, the downside and upside internal terminals 80b, 84b are connected with each other according to the bending process shown in FIGS. 25, 26.

Accordingly, the noise suppressing filter 71 can be easily manufactured in the same manner as the noise suppressing filter 21.

Figure 30A:
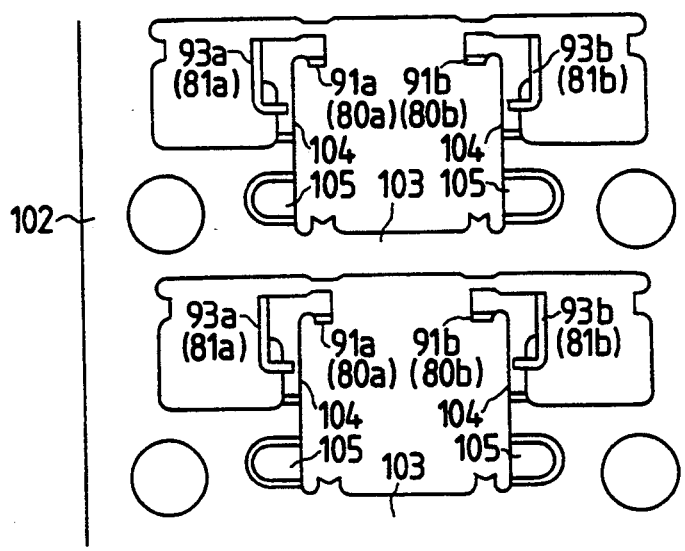
FIG. 30A is a plan view of a bent metallic plate obtained by bending the punched metallic plate shown in FIG. 20, according to a second modification of the fifth embodiment.
Figure 30C:
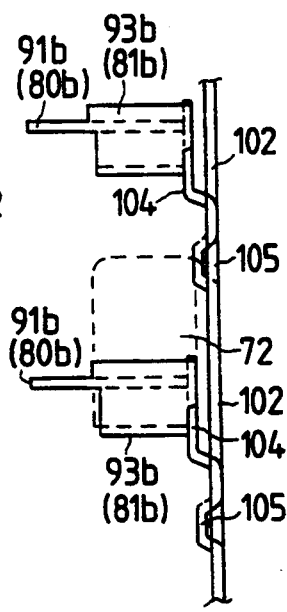
FIG. 30C is a side view of the bent metallic plate shown in FIG. 30A.
Figure 30B:
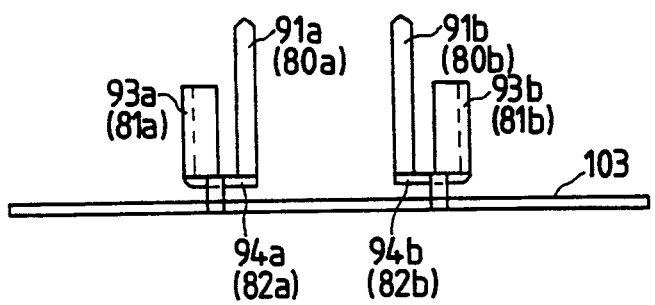
FIG. 30B is a front view of the bent metallic plate shown in FIG. 30A.

FIG. 30A is a plan view of a bent metallic plate obtained by bending the punched metallic plate shown in FIG. 20, according to a second modification of the fifth embodiment. FIG. 30B is a front view of the bent metallic plate shown in FIG. 30A. FIG. 30C is a side view of the bent metallic plate shown in FIG. 30A.

As shown in FIGS. 30A to 30C, a developed terminal obtained by developing the metallic terminal 73 shown in FIG. 15C is produced in the same direction as an extending direction of the main frame 102. In this case, the wide base portions 93a, 93b are arranged at right angles to a longitudinal direction of the metallic plate. Thereafter, the downside portions 91a, 91b, the upside portions 92a, 92b, and the wide base portions 93a, 93b of the metallic plate shown in FIG. 20 are bent to perpendicularly rise those portions. Thereafter, the ferrite core 72 with the chip capacitor 74 is forcibly fitted into the metallic terminal 73 in the same manner as the ferrite core 21 shown in FIGS. 24A to 24E. In this case, as shown in FIG. 30C, the ferrite core 72 is put on the joint portions 94a, 94b and ferrite core supporting portions 105.

Thereafter, the downside and upside internal terminals 80a, 84a are connected with each other according to the bending process shown in FIGS. 25, 26. In addition, the downside and upside internal terminals 80b, 84b are connected with each other according to the bending process shown in FIGS. 25, 26.

Accordingly, because the developed terminal is produced in the same direction as the extending direction of the main frame 102, the metallic plate can be efficiently utilized.

Also, because the ferrite core supporting portions 105 is provided in the punched metallic plate, the ferrite core 72 can be stably put on the joint portions 94a, 94b.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:
1. A chip type of noise suppressing filter, comprising:
   a rectangular solid shaped ferrite core in which a magnetic field is induced, the ferrite core having a pair of end portions at two ends thereof, a front side and a back side between said end portions, a first groove on said front side and a second groove on said back side;
   at least two penetration holes respectively penetrating into a central portion of the ferrite core from said first groove on said front side of the ferrite core to said second groove on said back side of the ferrite core; and
   a plate type of metallic terminal in which an electric current flows across the magnetic field induced in the ferrite core, the metallic terminal comprising
   (1) two internal terminals arranged in the corresponding penetration holes, the internal terminals being connected with each other in said second groove of the ferrite core, and
   (2) two external terminals fitted to the corresponding end portions of the ferrite core, the external terminals being integrally formed with the corresponding internal terminals in the first qroove of the ferrite core.

2. A filter according to the claim 1 in which the external terminals respectively extend in said first qroove of the ferrite core.

3. A filter according to the claim 1 in which the internal terminals are arranged in parrellel.

* * * * *